United States Patent
Wang et al.

(10) Patent No.: US 12,490,613 B2
(45) Date of Patent: Dec. 2, 2025

(54) DISPLAY ASSEMBLY AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yangpeng Wang, Beijing (CN); Zhenhua Zhang, Beijing (CN); Yingsong Xu, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 618 days.

(21) Appl. No.: 17/800,576

(22) PCT Filed: Aug. 13, 2021

(86) PCT No.: PCT/CN2021/112423
§ 371 (c)(1),
(2) Date: Aug. 18, 2022

(87) PCT Pub. No.: WO2022/062761
PCT Pub. Date: Mar. 31, 2022

(65) Prior Publication Data
US 2023/0105238 A1    Apr. 6, 2023

(30) Foreign Application Priority Data
Sep. 27, 2020   (CN) .......................... 202011035412.0

(51) Int. Cl.
H10K 59/131    (2023.01)
G09G 3/3225   (2016.01)
(Continued)

(52) U.S. Cl.
CPC ....... *H10K 59/1315* (2023.02); *G09G 3/3225* (2013.01); *H10D 86/441* (2025.01);
(Continued)

(58) Field of Classification Search
CPC ............. H10K 59/123; H10K 59/1315; H10K 59/1213; H10K 59/65; H10K 59/131;
(Continued)

(56) References Cited

U.S. PATENT DOCUMENTS

2007/0002188 A1\* 1/2007 Kumagai ............. G09G 3/3688
348/751
2009/0147177 A1\* 6/2009 Lee ........................ H10K 59/18
349/61
(Continued)

FOREIGN PATENT DOCUMENTS

| CN | 111028757 A | 4/2020 |
|---|---|---|
| CN | 111063719 A | 4/2020 |
| CN | 112151588 A | 12/2020 |

*Primary Examiner* — Shaheda A Abdin
(74) *Attorney, Agent, or Firm* — XSENSUS LLP

(57) ABSTRACT

A display assembly includes a display panel and a driving panel. The display panel has a display region and a non-display region, and the display region includes a first display region and a second display region that are adjacent. The display panel includes first pixel driving circuits, first light-emitting devices, and second light-emitting devices; the first pixel driving circuits and the first light-emitting devices are located in the first display region, and a first pixel driving circuit is coupled to a first light-emitting device and configured to drive the first light-emitting device to emit light; and the second light-emitting devices are located in the second display region. The drive panel includes second pixel
(Continued)

driving circuits, a second pixel driving circuit is coupled to a second light-emitting device, and configured to drive the second light-emitting device to emit light.

19 Claims, 21 Drawing Sheets

(51) Int. Cl.
    *H10D 86/40*     (2025.01)
    *H10D 86/60*     (2025.01)
    *H10K 59/121*     (2023.01)
    *H10K 59/65*     (2023.01)

(52) U.S. Cl.
    CPC ......... *H10D 86/60* (2025.01); *H10K 59/1213* (2023.02); *H10K 59/65* (2023.02)

(58) Field of Classification Search
    CPC ................ H10K 59/121; H10K 59/129; H10K 2102/311; H10D 86/441; G09G 3/3225; G09G 2300/0861; G09G 2300/0819; G09G 3/3233; G09G 2300/0842
    See application file for complete search history.

(56) References Cited

U.S. PATENT DOCUMENTS

| | | | |
|---|---|---|---|
| 2013/0334543 A1* | 12/2013 | Kim | G02F 1/13454 257/79 |
| 2017/0031643 A1* | 2/2017 | Jeong | G06F 1/1647 |
| 2020/0126479 A1* | 4/2020 | Yamasaki | G09G 3/3225 |
| 2020/0302860 A1* | 9/2020 | Kim | G09G 3/325 |
| 2021/0098550 A1* | 4/2021 | Moon | H10K 59/1216 |
| 2021/0201762 A1 | 7/2021 | He | |

\* cited by examiner

DISPLAY ASSEMBLY AND DISPLAY APPARATUS

CROSS-REFERENCE TO RELATED APPLICATIONS

This application is a national phase entry under 35 USC 371 of International Patent Application No. PCT/CN2021/112423, filed on Aug. 13, 2021, which claims priority to Chinese Patent Application No. 202011035412.0, filed on Sep. 27, 2020, which are incorporated herein by reference in their entity.

TECHNICAL FIELD

The present disclosure relates to the field of display technologies, and in particular, to a display assembly and a display apparatus.

BACKGROUND

Organic light-emitting diode (OLED) displays are two-dimensional displays using organic light-emitting diodes as light-emitting devices, and have broad application prospects due to their advantages of simple manufacturing process, low cost, fast response speed, being easy to achieve color display and large-screen display, low power consumption, high luminance, wide adaptation range of operating temperature, light weight and small size, being easy to achieve flexible display, and the like.

SUMMARY

In an aspect, a display assembly is provided. The display assembly includes a display panel and a driving panel. The display panel has a display region and a non-display region. The display region includes a first display region and a second display region that are adjacent. The display panel includes first pixel driving circuits, first light-emitting devices and second light-emitting devices. The first pixel driving circuits and the first light-emitting devices are located in the first display region. A first pixel driving circuit is coupled to a first light-emitting device and configured to drive the first light-emitting device to emit light. The second light-emitting devices are located in the second display region. The driving panel includes second pixel driving circuits, a second pixel driving circuit is coupled to a second light-emitting device and configured to drive the second light-emitting device to emit light.

In some embodiments, the display panel further includes a first bonding portion located in the non-display region, the driving panel further includes a second bonding portion, and the display panel is coupled to the driving panel through the first bonding portion and the second bonding portion.

In some embodiments, the first bonding portion includes a plurality of first bonding pads, and the second bonding portion includes a plurality of second bonding pads. The plurality of first bonding pads are directly coupled to the plurality of second bonding pads. Alternatively, the display assembly further includes a flexible printed circuit, and the plurality of first bonding pads are coupled to the plurality of second bonding pads through the flexible printed circuit.

In some embodiments, the display panel further includes first connecting lines; at least a portion of each first connecting line is located in the second display region, and a first connecting line couples the second light-emitting device to the second pixel driving circuit.

In some embodiments, a material of the portion of the first connecting line located in the second display region is a transparent conductive material.

In some embodiments, in a case where the display panel includes the first bonding portion and the driving panel includes the second bonding portion:
the display panel further includes a plurality of first signal lines, the plurality of first signal lines are each coupled to first pixel driving circuits and the first bonding portion, and configured to provide a driving signal for the first pixel driving circuits; and
the driving panel further includes a plurality of second signal lines, some of the plurality of second signal lines are each coupled to second pixel driving circuits and the second bonding portion, and configured to provide a driving signal for the second pixel driving circuits.

In some embodiments, the display panel further includes a plurality of third signal lines and at least one gate driving circuit, the plurality of third signal lines are coupled to the gate driving circuit and the first bonding portion, the plurality of third signal lines are configured to provide driving signals for the gate driving circuit, and the gate driving circuit is configured to provide scanning signals for a part of the first signal lines.

The driving panel further includes second connecting lines, each second connecting line is coupled to a respective one of the plurality of third signal lines through the second bonding portion and the first bonding portion.

In some embodiments, the plurality of first signal lines include first scanning signal lines and first data signal lines, the plurality of second signal lines include second scanning signal lines and second data signal lines; each first scanning signal line and a respective second scanning signal line are coupled to be a scanning signal line, and each first data signal line and a respective second data signal line are coupled to be a data signal line.

The scanning signal line is coupled to first pixel driving circuits each coupled to a first light-emitting device and second pixel driving circuits each coupled to a second light-emitting device in a same row as the first light-emitting device.

The data signal line is coupled to first pixel driving circuits each coupled to a first light-emitting device and second pixel driving circuits each coupled to a second light-emitting device in a same column as the first light-emitting device. First light-emitting devices and second light-emitting devices in a column consist of light-emitting devices with same orders in rows of light-emitting devices, and a part of the rows of light-emitting devices each include first light-emitting devices and second light-emitting devices.

In some embodiments, the non-display region includes a first non-display region, a bendable region and a second non-display region that are sequentially away from the display region. In a case where the display panel further includes a first bonding portion, the first bonding portion is located in the second non-display region.

The bendable region is located between the first non-display region and the second non-display region, a portion of the display panel located in the bendable region is configured to bend a portion of the display panel located in the second non-display region to a non-light exit side of the display panel.

In some embodiments, in a case where the display panel further includes first scanning signal lines and first connecting lines:

a first scanning signal line includes a first scanning sub-pattern and a second scanning sub-pattern, the first scanning sub-pattern is located in the display region and the first non-display region, the second scanning sub-pattern is located in the bendable region and the second non-display region, and a conductivity of the second scanning sub-pattern is greater than a conductivity of the first scanning sub-pattern;

a first connecting line extends from the second display region into the second non-display region, the first connecting line includes a first connecting sub-pattern and a second connecting sub-pattern, the first connecting sub-pattern is located in the second display region and the first non-display region, the second connecting sub-pattern is located in the bendable region and the second non-display region, and a conductivity of the second connecting sub-pattern is greater than a conductivity of the first connecting sub-pattern.

In some embodiments, in a case where the display panel further includes first data signal lines:

a data signal line includes a first data sub-pattern, a second data sub-pattern and a third data sub-pattern, the first data sub-pattern is located in the display region, the second data sub-pattern is located in the first non-display region, the third data sub-pattern is located in the bendable region and the second non-display region; and the second data sub-pattern is disposed in a different layer from the first data sub-pattern and the third data sub-pattern.

In some embodiments, the first data signal line further includes a fourth data sub-pattern, and the fourth data sub-pattern is configured to couple the first data sub-pattern to the second data sub-pattern.

Alternatively, the first data sub-pattern and the third data sub-pattern are disposed in a same layer and made of a same material; the first data signal line further includes a fourth data sub-pattern and a fifth data sub-pattern, the fourth data sub-pattern is configured to couple the first data sub-pattern to the second data sub-pattern, and the fifth data sub-pattern is configured to couple the second data sub-pattern to the third data sub-pattern.

In some embodiments, the second scanning sub-pattern, the second connecting sub-pattern and the third data sub-pattern are disposed in a same layer and made of a same material.

In some embodiments, the second data sub-pattern and the first scanning sub-pattern are disposed in a same layer and made of a same material.

In some embodiments, a pixel density of the first light-emitting devices is equal to a pixel density of the second light-emitting devices.

In some embodiments, the driving panel further includes at least one first through hole, or has a first transparent region.

In another aspect, a display apparatus is provided. The display apparatus includes the display assembly according to any of above embodiments.

In some embodiments, the display apparatus further includes at least one front camera located on a non-light exit side of the display assembly.

In some embodiments, in a case where the driving panel in the display assembly further includes at least one first through hole, each front camera is located in a respective first through hole; or in a case where the driving panel in the display assembly has a first transparent region, an orthographic projection of the front camera on the display panel in the display assembly overlaps with an orthographic projection of the first transparent region on the display panel.

In some embodiments, the display apparatus further includes a driving chip coupled to the display assembly and configured to provide driving signals to the display assembly.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, but are not limitations on actual sizes of products, actual processes of methods and actual timings of signals involved in the embodiments of the present disclosure.

DETAILED DESCRIPTION

Figure 1A:
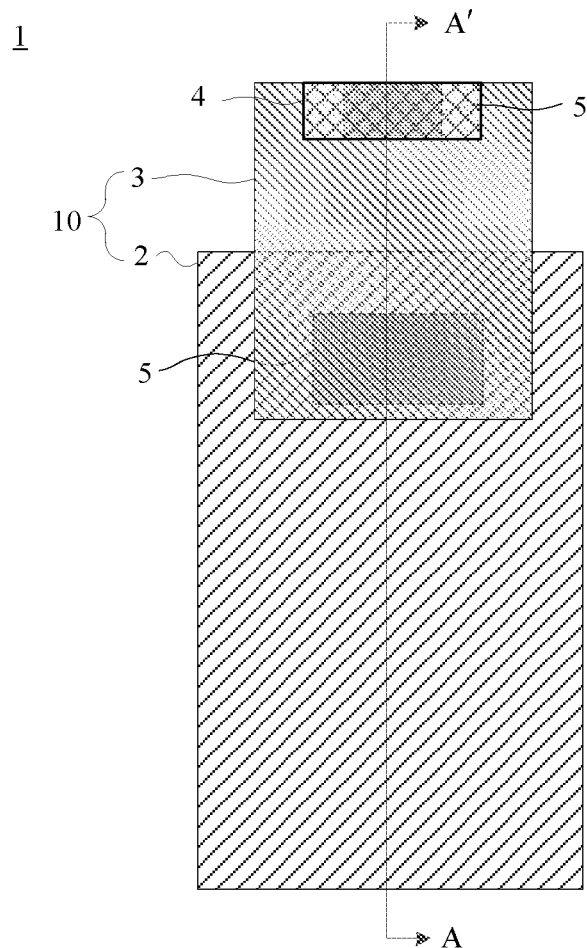
FIG. 1A is a top structural view of a display apparatus, in accordance with some embodiments of the present disclosure.
Figure 1B:
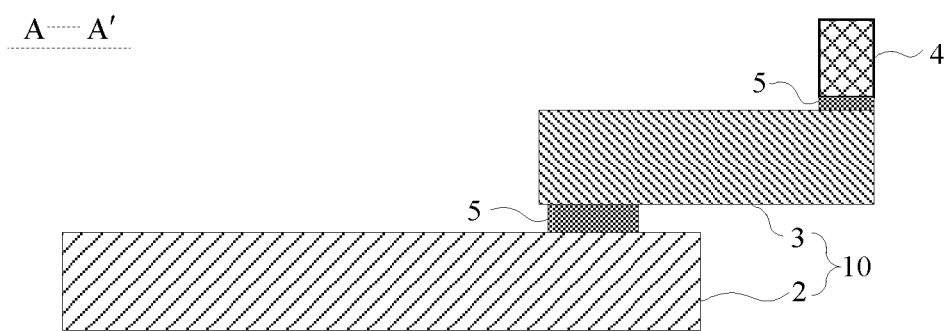
FIG. 1B is a longitudinal sectional structural view taken along the A-A direction in FIG. 1A.
Figure 1C:
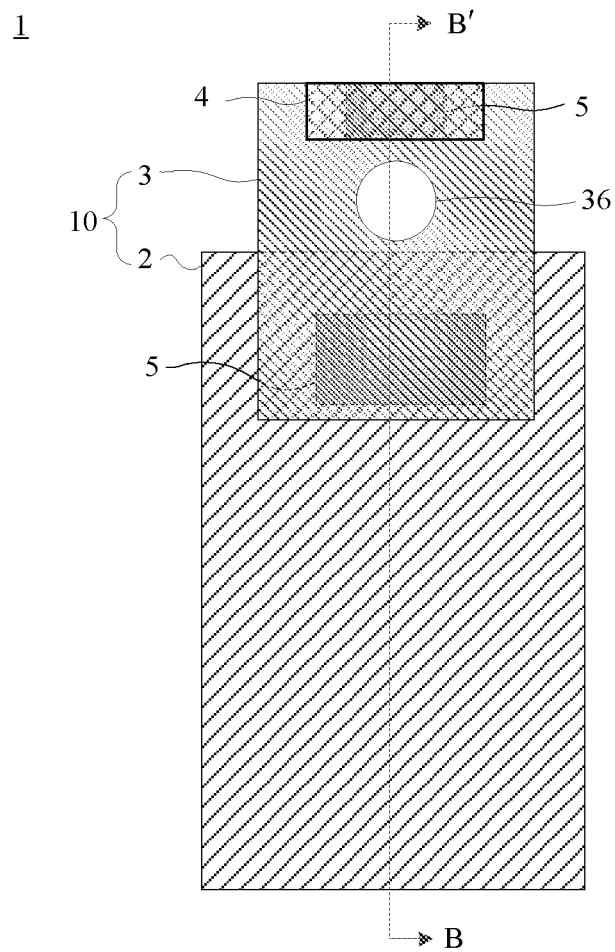
FIG. 1C is a top structural view of another display apparatus, in accordance with some embodiments of the present disclosure.
Figure 1D:
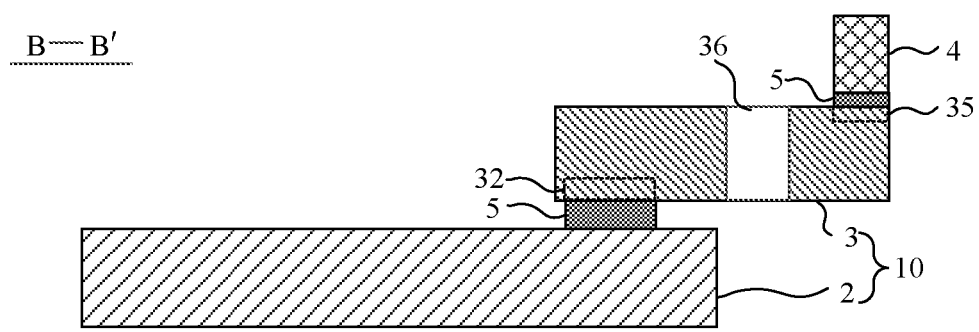
FIG. 1D is a longitudinal sectional structural view taken along the B-B' direction in FIG. 1C.
Figure 1E:
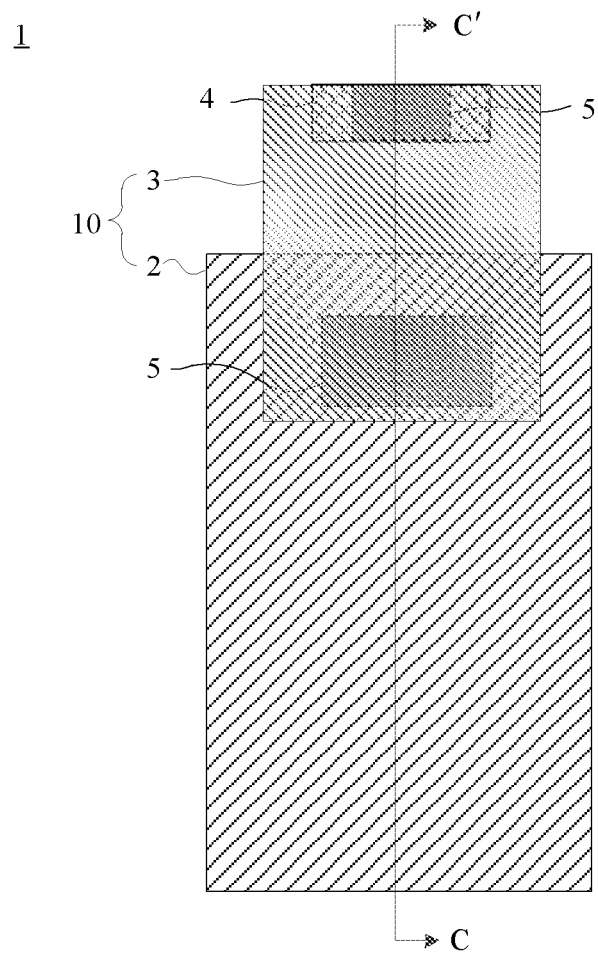
FIG. 1E is a top structural view of yet another display apparatus, in accordance with some embodiments of the present disclosure.
Figure 1F:
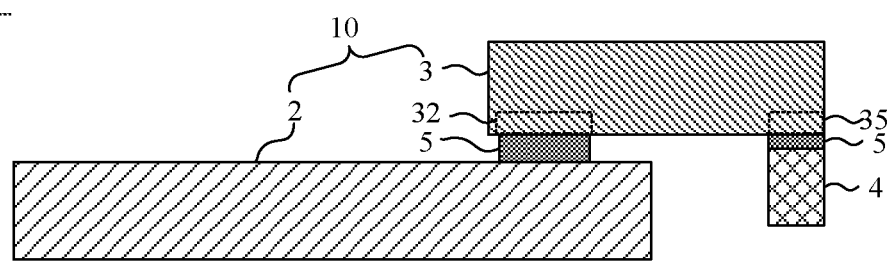
FIG. 1F is a longitudinal sectional structural view taken along the C-C' direction in FIG. 1E.
Figure 1G:
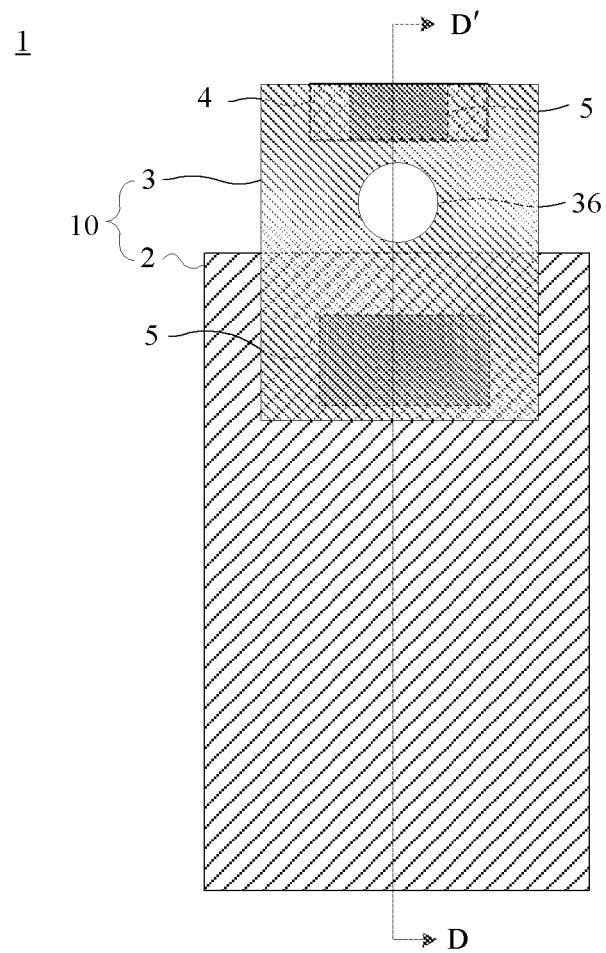
FIG. 1G is a top structural view of yet another display apparatus, in accordance with some embodiments of the present disclosure.
Figure 1H:
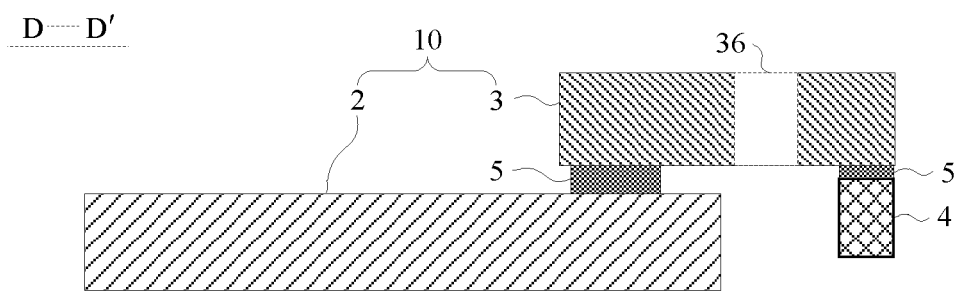
FIG. 1H is a longitudinal sectional structural view taken along the D-D' direction in FIG. 1G.
Figure 2A:
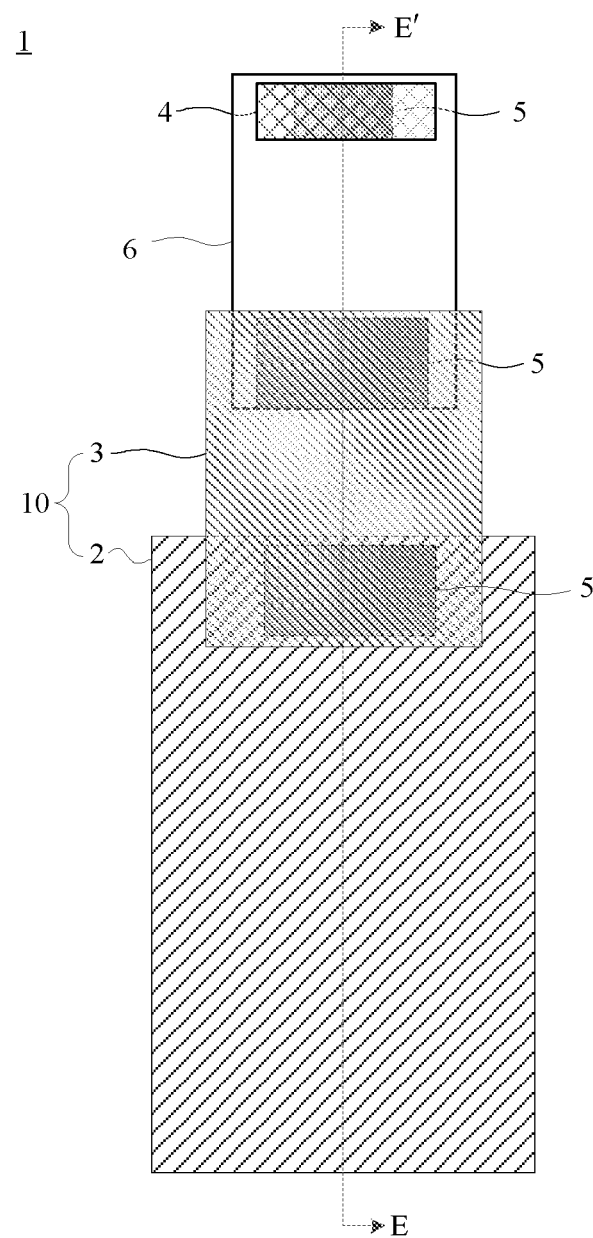
FIG. 2A is a top structural view of yet another display apparatus, in accordance with some embodiments of the present disclosure.
Figure 2B:
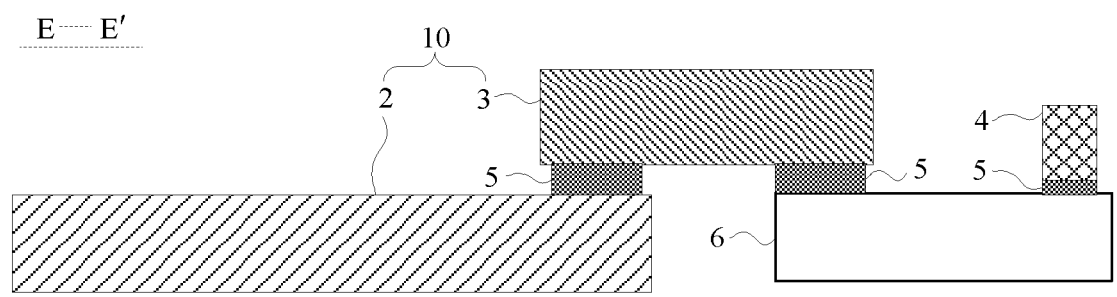
FIG. 2B is a longitudinal sectional structural view taken along the E-E' direction in FIG. 2A.
Figure 2C:
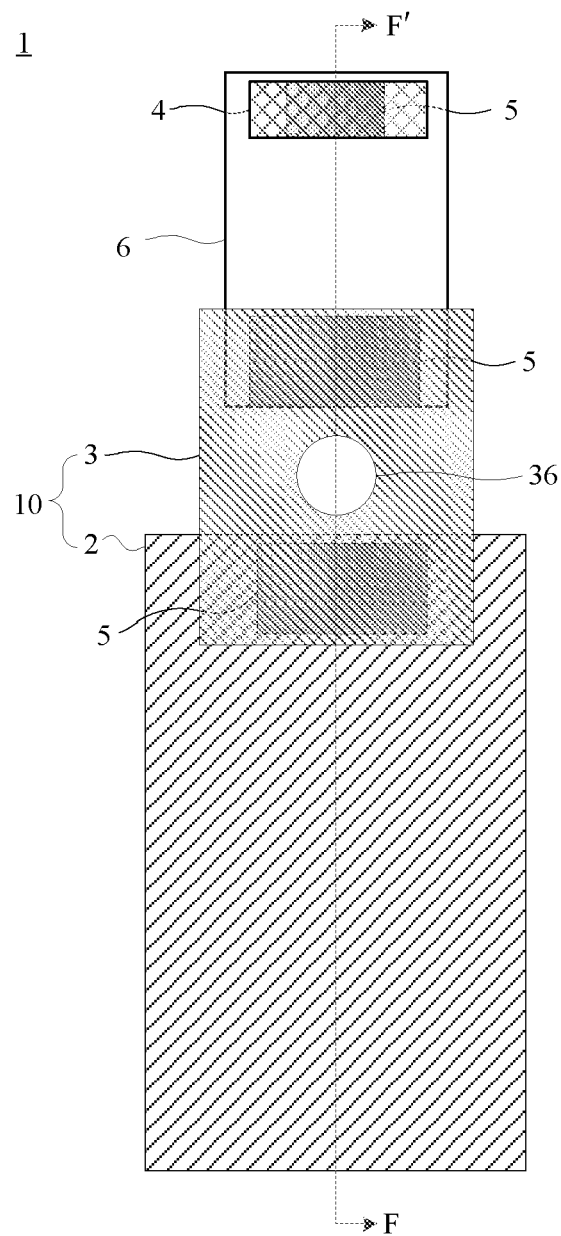
FIG. 2C is a top structural view of yet another display apparatus, in accordance with some embodiments of the present disclosure.
Figure 2D:
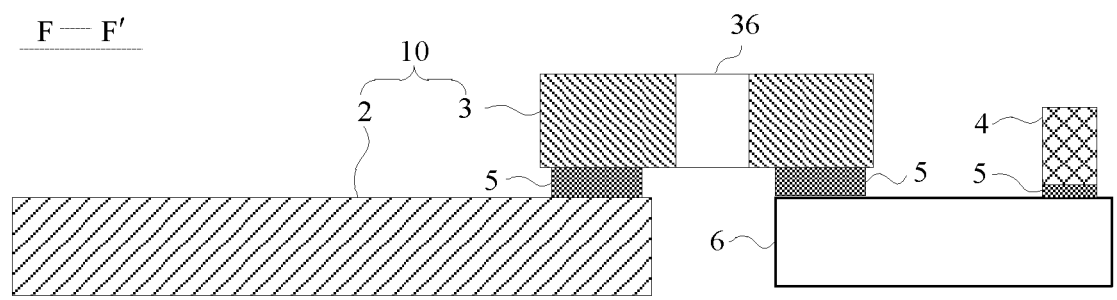
FIG. 2D is a longitudinal sectional structural view taken along the F-F' direction in FIG. 2O.
Figure 2E:
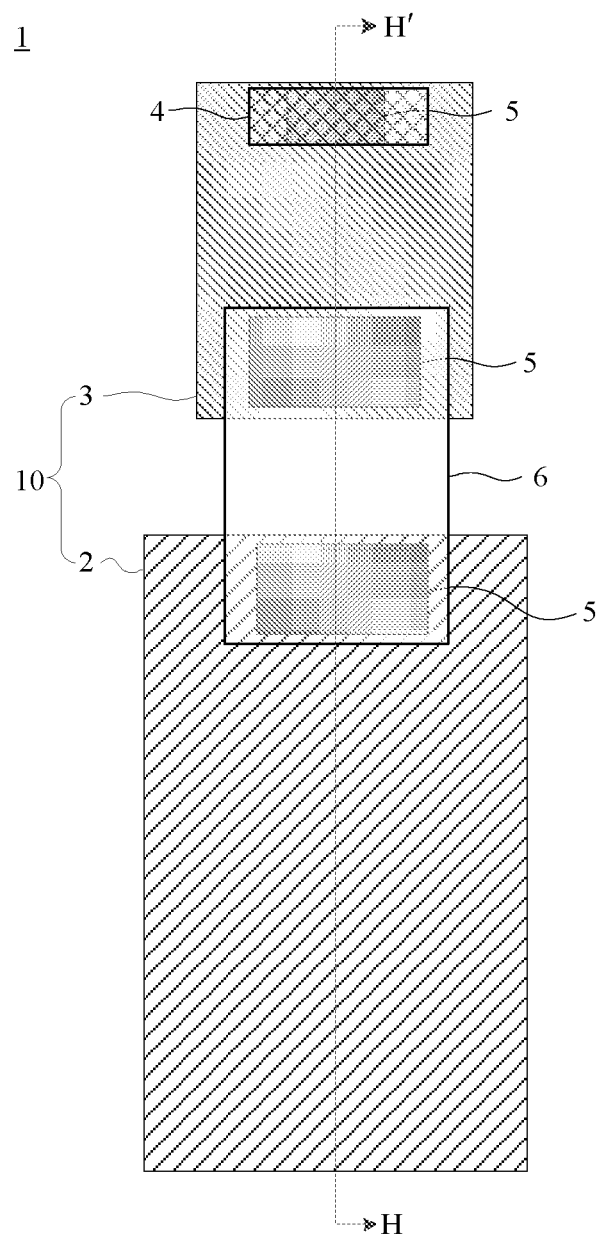
FIG. 2E is a top structural view of yet another display apparatus, in accordance with some embodiments of the present disclosure.
Figure 2F:
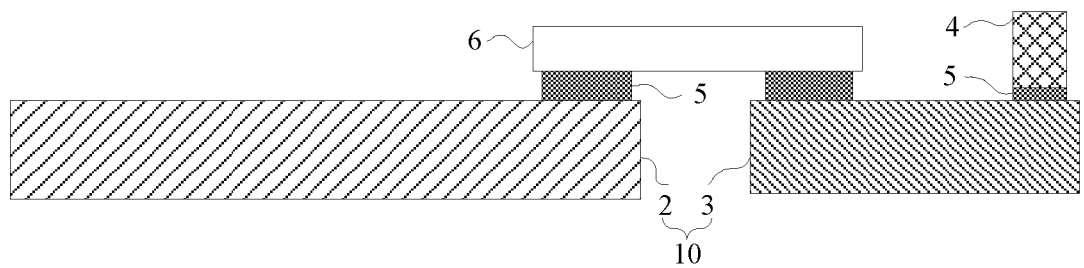
FIG. 2F is a longitudinal sectional structural view taken along the H-H' direction in FIG. 2E.
Figure 2G:
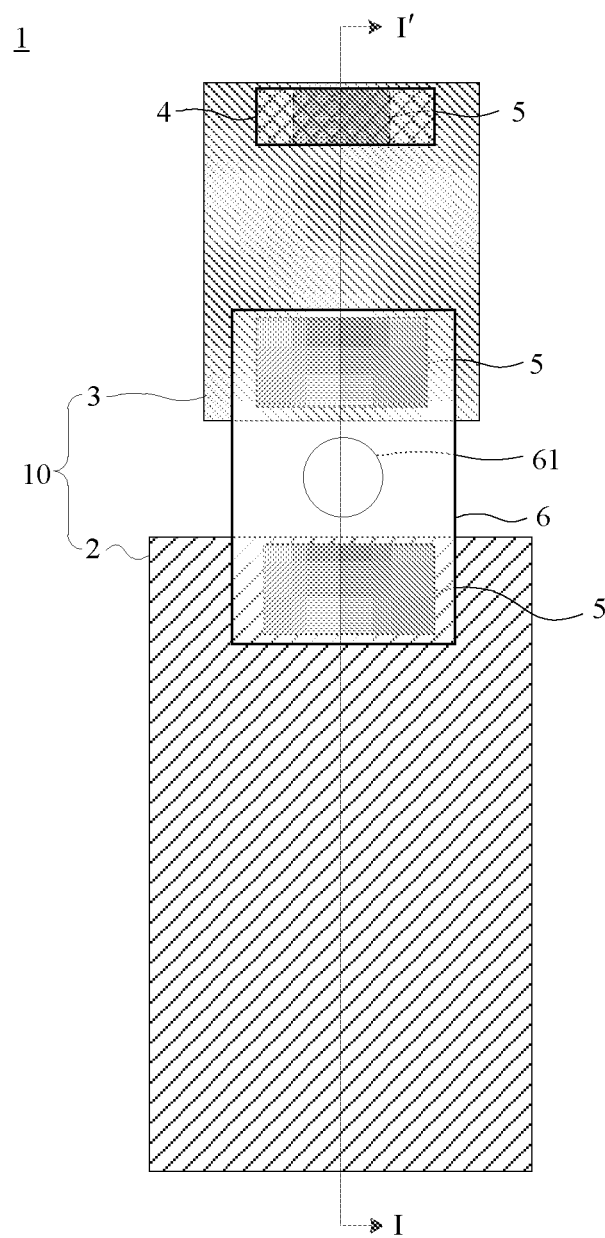
FIG. 2G is a top structural view of yet another display apparatus, in accordance with some embodiments of the present disclosure.
Figure 2H:
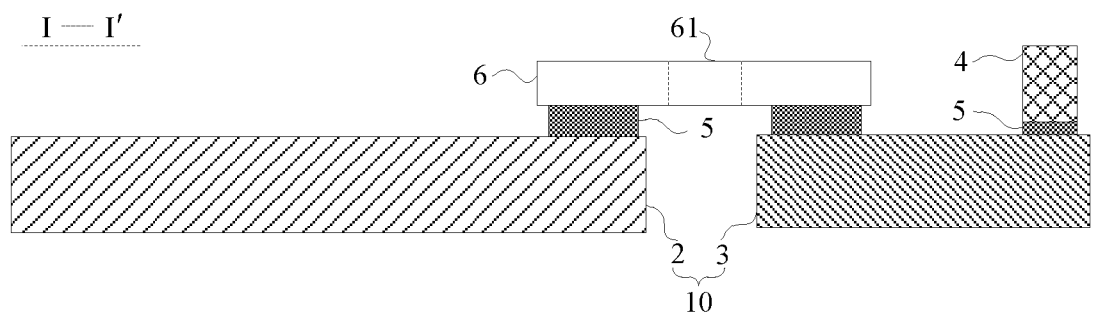
FIG. 2H is a longitudinal sectional structural view taken along the I-I' direction in FIG. 2G.
Figure 2I:
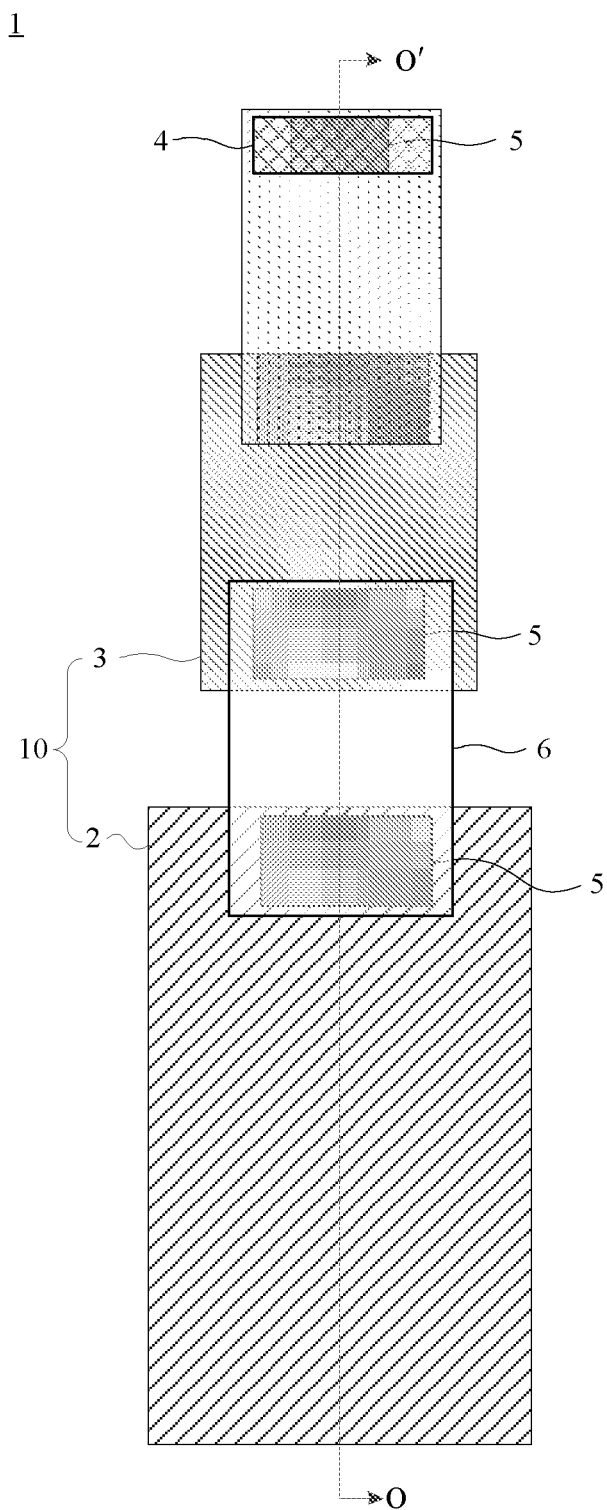
FIG. 2I is a top structural view of yet another display apparatus, in accordance with some embodiments of the present disclosure.
Figure 2J:
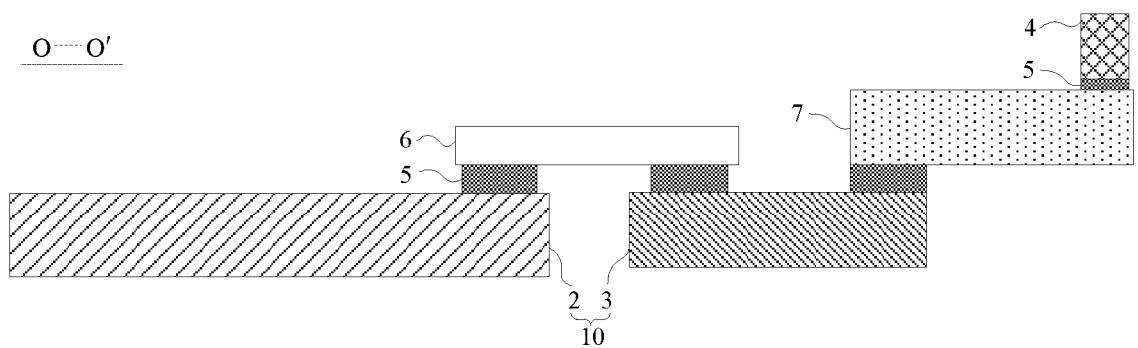
FIG. 2J is a longitudinal sectional structural view taken along the O-O' direction in FIG. 2I.
Figure 2K:
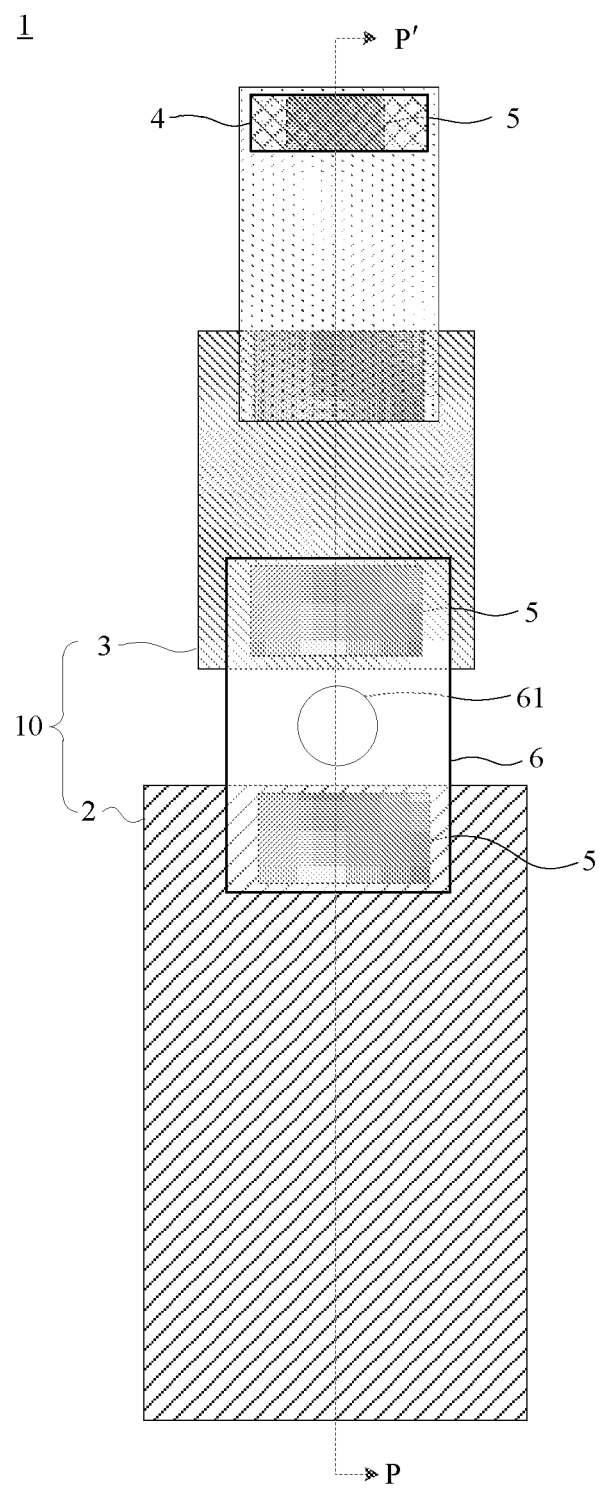
FIG. 2K is a top structural view of yet another display apparatus, in accordance with some embodiments of the present disclosure.
Figure 2L:
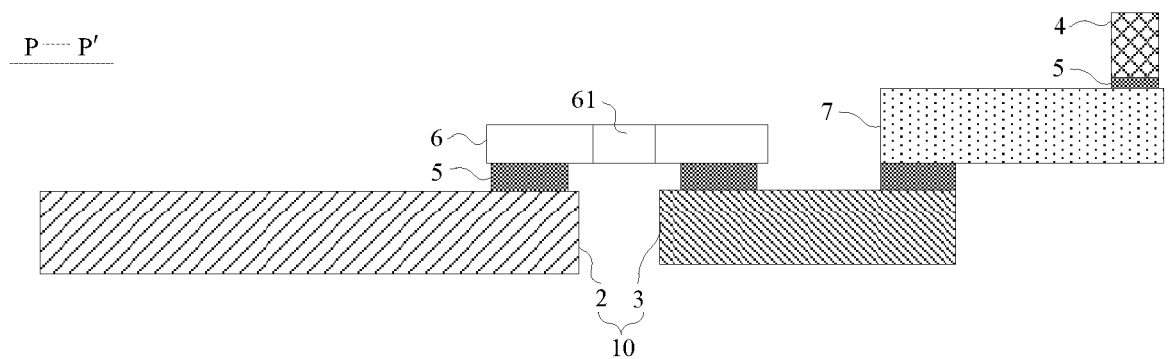
FIG. 2L is a longitudinal sectional structural view taken along the P-P' direction in FIG. 2K.

Technical solutions in some embodiments of the present disclosure will be described clearly and completely below with reference to accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, the terms "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, depending on the context, the term "if" is optionally construed as "when" or "in a case where" or "in response to determining that" or "in response to detecting". Similarly, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]", depending on the context.

The phrase "applicable to" or "configured to" as used herein means an open and inclusive expression, which does not exclude devices that are applicable to or configured to perform additional tasks or steps.

In addition, the phrase "based on" used herein is meant to be open and inclusive, since a process, step, calculation, or other action that is "based on" one or more of the stated conditions or values may, in practice, be based on additional conditions or values exceeding those stated.

The term "about", "approximately", or "substantially" as used herein includes a stated value and an average value within an acceptable range of deviation of a particular value. The acceptable range of deviation is determined by a person of ordinary skill in the art in consideration of measurement in question and errors associated with measurement of a particular quantity (i.e., limitations of a measurement system).

As used herein, the term "a single layer" should be understood as including one layer, "bilayer" should be understood as including two layers, and "multilayer" should be understood as including two or more layers.

As used herein, "a first electrode" of a thin film transistor is, for example, a source, and "a second electrode" of the thin film transistor is, for example, a drain, and vice versa.

Exemplary embodiments are described herein with reference to sectional views and/or plan views as idealized exemplary accompanying drawings. In the accompanying drawings, thickness of layers and sizes of regions are enlarged for clarity. Variations in shapes relative to the drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a display apparatus, and the display apparatus is, for example, an organic light-emitting diode (OLED) display apparatus or a quantum dot light-emitting diode (QLED) display apparatus.

With reference to FIGS. 1A to 1H and FIGS. 2A to 2L, the display apparatus 1 provided by some embodiments of the present disclosure includes a display assembly 10 and a driving chip 4. The driving chip 4 is configured to provide the display assembly 10 with various signals required for display. The display assembly 10 is configured to display videos or images.

The display assembly 10 includes a display panel 2 and a driving panel 3 that are coupled, and the driving panel 3 is configured to provide driving signals for the display panel 2.

For example, with reference to FIGS. 1A to 1H and FIGS. 2A to 2D, the display panel 2 is directly coupled to the driving panel 3, and the driving panel 3 may directly transmit the driving signals to the display panel 2.

For another example, with reference to FIGS. 2E to 2L, the display panel 2 and the driving panel 3 are indirectly coupled through a flexible printed circuit (FPC) 6, and the driving signals provided by the driving panel 3 are transmitted to the display panel 2 through the FPC 6.

With reference to FIGS. 1A to 1H and FIGS. 2A to 2L, whether the display panel 2 is directly coupled to the driving panel 3 or the display panel 2 is indirectly coupled to the driving panel 3 through the FPC 6, a conductive medium 5 is required to achieve bonding between the display panel 2 and the driving panel 3, or conductive media 5 are required to achieve bonding between the display panel 2 and the FPC 6 and bonding between the driving panel 3 and the FPC 6. The conductive medium is, for example, anisotropic conductive film (ACF).

Figure 3A:
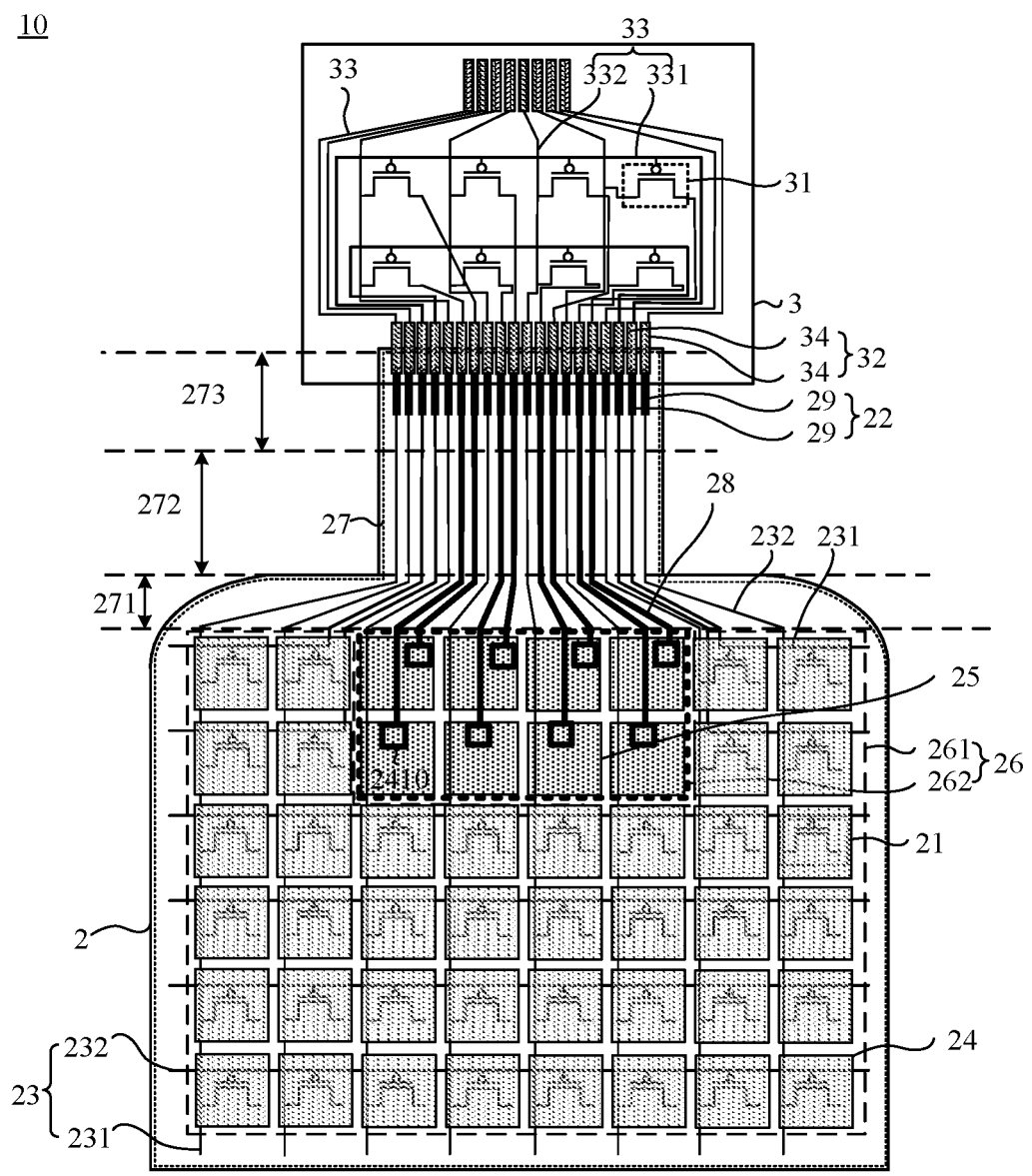
FIG. 3A is a top structural view of a display assembly, in accordance with some embodiments of the present disclosure.
Figure 3B:
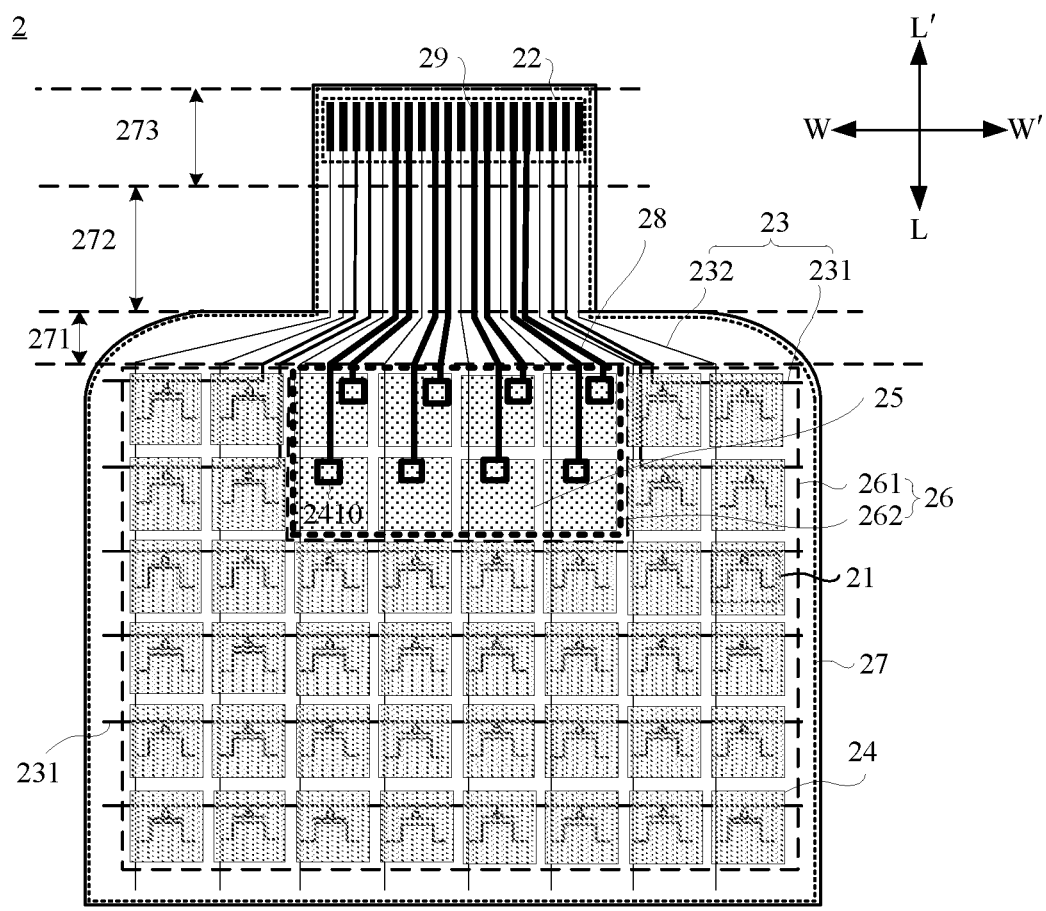
FIG. 3B is a top structural view of a display panel, in accordance with some embodiments of the present disclosure.
Figure 3C:
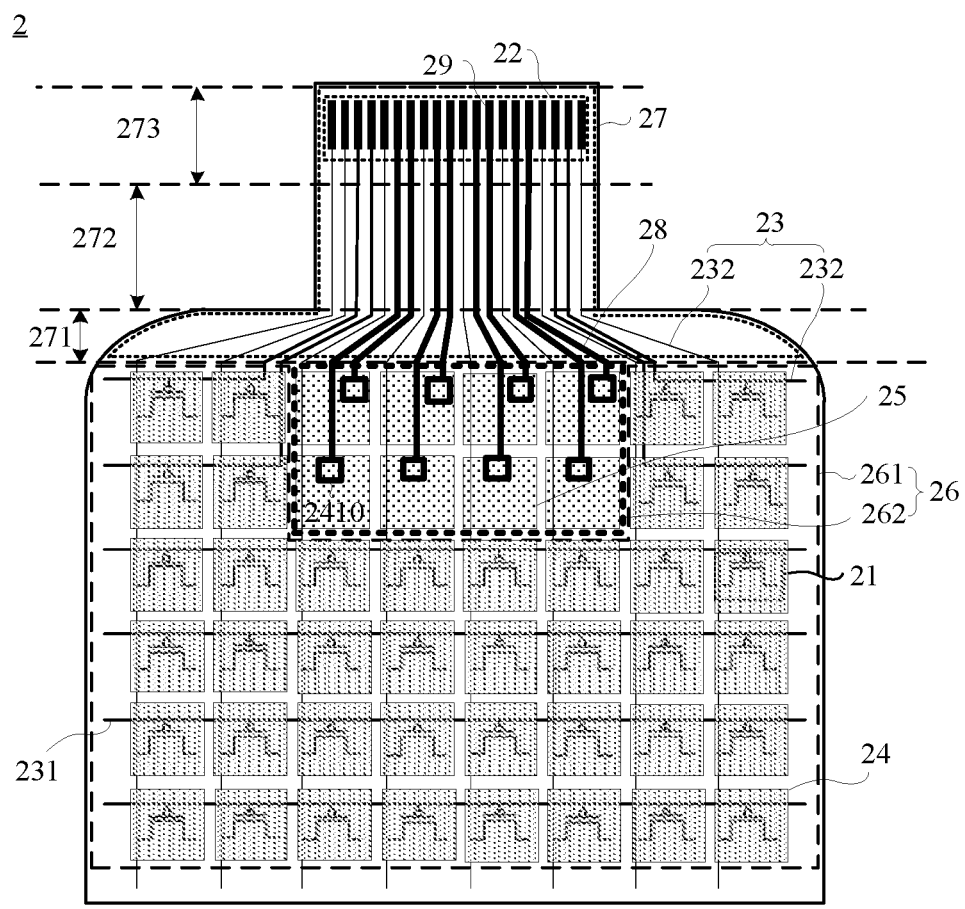
FIG. 3C is a top structural view of another display panel, in accordance with some embodiments of the present disclosure.

With reference to FIGS. 3A to 3C, the display panel 2 has a display region 26 and a non-display region 27, and the display region 26 includes a first display region 261 and a second display region 262 that are adjacent. A region of the display panel 2 other than the display region 26 is the non-display region 27. With reference to FIGS. 3A and 3B, the display panel 2 is a non-full-screen display panel, and in this case, the non-display region 27 is arranged around a periphery of the display region 26. Alternatively, with reference to FIG. 3C, the display panel 2 is a full-screen display panel, and in this case, the non-display region 27 is only next to one side (e.g., an upper side) of the display region 26, an area of the non-display region 27 is small, and a screen-to-body ratio of the display panel 2 is high.

For example, with reference to FIG. 3B, the L-L' direction in the figure is, for example, a length direction of the display panel 2, and the W-W direction in the figure is, for example, a width direction of the display panel 2.

Based on this, for example, with reference to FIGS. 3A to 3C, the display region 26 and the second display region 262 are each in a shape of a rectangle, the first display region 261 is in a shape of a rectangle with a rectangular notch, and three sides of the second display region 262 are next to the first display region 261.

Further, with reference to FIGS. 3A to 3C, the display panel 2 includes first pixel driving circuits 21, first light-emitting devices 24 and second light-emitting devices 25. The first pixel driving circuits 21 and the first light-emitting devices 24 are located in the first display region 261. The first pixel driving circuit 21 is coupled to a first light-emitting device 24, and the first pixel driving circuit 21 is configured to drive the first light-emitting device 24 to emit light. The second light-emitting devices 25 are located in the second display region 262.

Figure 4A:
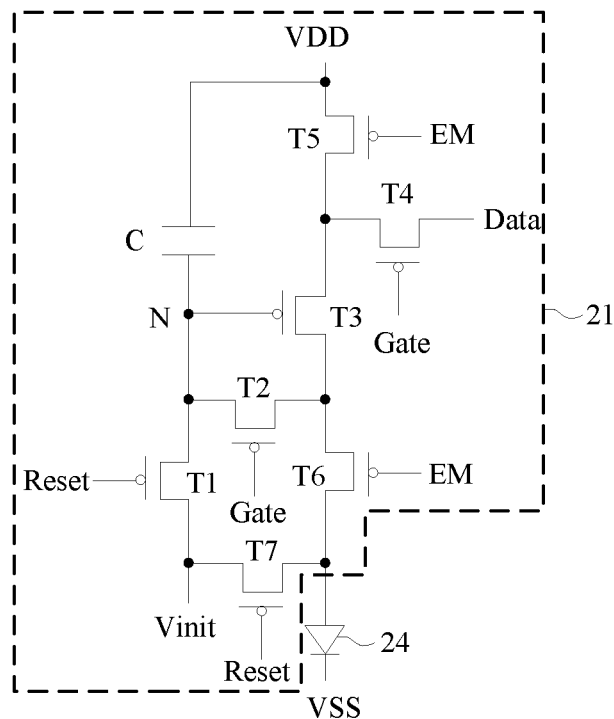
FIG. 4A is an equivalent circuit diagram of a first pixel driving circuit and a first light-emitting device, in accordance with some embodiments of the present disclosure.

For example, FIG. 4A is an equivalent circuit diagram of the first pixel driving circuit 21 and the first light-emitting device 24. The first pixel driving circuit 21 includes a first transistor T1, a second transistor T2, a third transistor T3, a fourth transistor T4, a fifth transistor T5, a sixth transistor T6, a seventh transistor T7 and a capacitor C. For example, the first transistor T1 to the seventh transistor T7 are all P-type thin film transistors or all N-type thin film transistors. In the embodiments of the present disclosure, the first transistor T1 to the seventh transistor T7 are all the P-type thin film transistors for illustration only, and the type of the first transistor T1 to seventh transistor T7 are not thus limited.

A gate of the first transistor T1 is coupled to a reset signal terminal Reset, a first electrode of the first transistor T1 is coupled to an initialization signal terminal Vinit, and a second electrode of the first transistor T1 is coupled to a node N.

A gate of the second transistor T2 is coupled to a gate driving signal terminal Gate, a first electrode of the second transistor T2 is coupled to a second electrode of the third transistor T3, and a second electrode of the second transistor T2 is coupled to the node N.

A gate of the third transistor T3 is coupled to the node N, a first electrode of the third transistor T3 is coupled to a second electrode of the fourth transistor T4, and the third transistor T3 is a driving transistor.

A gate of the fourth transistor T4 is coupled to the gate driving signal terminal Gate, and a first electrode of the fourth transistor T4 is coupled to a data signal terminal Data.

A gate of the fifth transistor T5 is coupled to a light-emitting control signal terminal EM, a first electrode of the fifth transistor T5 is coupled to a power supply voltage signal terminal VDD, and a second electrode of the fifth transistor T5 is coupled to the first electrode of the third transistor T3.

A gate of the sixth transistor T6 is coupled to the light-emitting control signal terminal EM, a first electrode of the sixth transistor T6 is coupled to the second electrode of the third transistor T3, and a second electrode of the sixth transistor T6 is coupled to a first electrode of the first light-emitting device 24. A second electrode of the first light-emitting device 24 is coupled to another power supply voltage signal terminal VSS. The first electrode of the first light-emitting device 24 is, for example, an anode, and the second electrode of the first light-emitting device 24 is, for example, a cathode. In some embodiments, a second power supply voltage signal provided by the power supply voltage signal terminal VSS is, for example, 0V.

A gate of the seventh transistor T7 is coupled to the reset signal terminal Reset, a first electrode of the seventh transistor T7 is coupled to the initialization signal terminal Vinit, and a second electrode of the seventh transistor T7 is coupled to the second electrode of the sixth transistor T6. An initialization signal provided by the initialization signal terminal Vinit is, for example, 0V.

An end of the capacitor C is coupled to the node N, and another end of the capacitor C is coupled to the power supply voltage signal terminal VDD. A first power supply voltage signal provided by the power supply voltage signal terminal VDD is, for example, 5V.

An operating process of the first pixel driving circuit 21 includes, for example, the following phases.

In a reset phase, under control of the reset signal terminal Reset, the first transistor T1 and the seventh transistor T7 are turned on. The first transistor T1 transmits the initialization signal provided by the initialization signal terminal Vinit to the node N to reset the node N, and the seventh transistor T7 transmits the initialization signal provided by the initialization signal terminal Vinit to the first electrode of the first light-emitting device 24 to reset the first electrode of the first light-emitting device 24.

In a data writing phase, under control of the gate driving signal terminal Gate, the second transistor T2 and the fourth transistor T4 are turned on, and the third transistor T3 is in a self-saturated state. As a result, the fourth transistor T4 transmits a data signal provided by the data signal terminal Data to the node N through the third transistor T3 and the second transistor T2, and the capacitor C starts to be charged.

In a light-emitting phase, under control of the light-emitting control signal terminal EM, the fifth transistor T5 and the sixth transistor T6 are turned on. The fifth transistor T5 transmits the first power supply voltage signal provided by the power supply voltage signal terminal VDD to the first electrode of the third transistor T3. Under control of the node N and the first power supply voltage signal, the second electrode of the third transistor T3 outputs the driving signal to the first light-emitting device 24 through the sixth transistor T6 to drive the first light-emitting device 24 to emit light.

The first pixel driving circuit 21 including seven thin film transistors and one capacitor C may be referred to as a 7T1C-type pixel driving circuit. For another example, the first pixel driving circuit 21 may be a 2T1C-type pixel driving circuit, which includes two thin film transistors and one capacitor C.

Figure 4B:
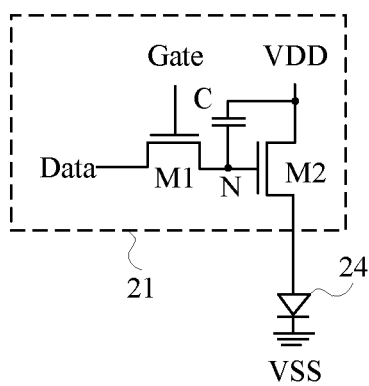
FIG. 4B is an equivalent circuit diagram of another first pixel driving circuit and a first light-emitting device, in accordance with some embodiments of the present disclosure.

For example, FIG. 4B is the structure of the 2T1C-type first pixel driving circuit 21. The 2T1C-type first pixel driving circuit 21 includes a transistor M1, a transistor M2 and a capacitor C, and the transistor M2 is a driving transistor. A gate of the transistor M1 is electrically connected to a gate driving signal terminal Gate, a first electrode of the transistor M1 is electrically connected to a data signal terminal Data, and a second electrode of the transistor M1 is electrically connected to a node N. A gate of the transistor M2 is electrically connected to the node N, a first electrode of the transistor M2 is electrically connected to a power supply voltage signal terminal VDD, and a second electrode of the transistor M2 is electrically connected to a first electrode of the first light-emitting device 24. An end of the capacitor C is electrically connected to the node N, and another end of the capacitor C is electrically connected to the power supply voltage signal terminal VDD. A second electrode of the first light-emitting device 24 is electrically connected to another power supply voltage signal terminal VSS.

For example, an operating process of the 2T1C-type first pixel driving circuit 21 is as follows.

In a data writing phase, under control of the gate driving signal terminal Gate, the transistor M1 is turned on to transmit a data signal provided by the data signal terminal Data to the node N, and to charge the capacitor C.

In a light-emitting phase, the transistor M1 is turned off, and the node N is floating. Under action of the power supply voltage signal terminal VDD, the capacitor C starts to discharge, so that a potential of the node N further increases. As a result, the node N controls the transistor M2 to be turned on, so as to drive the first light-emitting device 24 to emit light.

The above description of the structure of the first pixel driving circuit 21 is only exemplified, and does not limit the structure of the first pixel driving circuit 21. Other types of pixel driving circuit may also be applicable to the display apparatus 1 in the embodiments of the present disclosure.

The structure of the first light-emitting device 24 and a structure of the second light-emitting device 25 are the same, for example, both are OLED light-emitting devices.

The structures of the first light-emitting device 24 and the second light-emitting device 25 will be described below by considering the first light-emitting device 24 as an example. For example, with reference to FIG. 5, the first light-emitting device 24 includes a first electrode 241 and a second electrode 242 disposed opposite to each other, and a first light-emitting functional pattern 243 located between the first electrode 241 and the second electrode 242.

A material of the first electrode 241 is a transparent conductive material, such as indium tin oxide (ITO). A material of the second electrode 242 is, for example, metal, such as silver (Ag) or aluminum (Al). The second electrode 242 is, for example, a translucent electrode.

Figure 5:
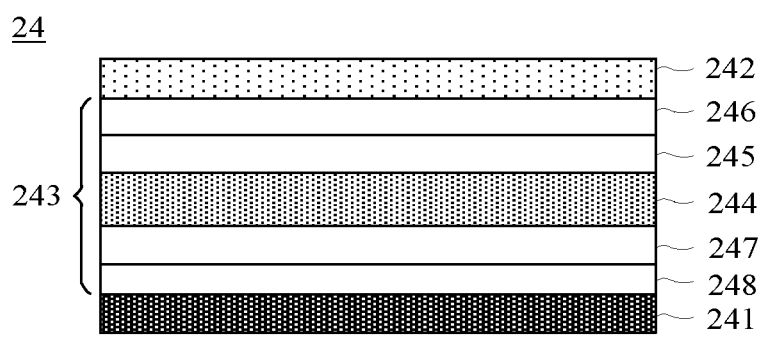
FIG. 5 is a structural diagram of a first light-emitting device, in accordance with some embodiments of the present disclosure.

The first light-emitting functional pattern 243 includes at least a light-emitting pattern 244, and a material of the light-emitting pattern 244 is an organic or inorganic light-emitting material, such as a fluorescent material. The first light-emitting functional pattern 243 may further include one pattern or more patterns of an electron transport pattern 245, an electron injection pattern 246, a hole transport pattern 247, and a hole injection pattern 248. FIG. 5 only illustrates that the first light-emitting functional pattern 243 further includes the electron transport pattern 245, the electron injection pattern 246, the hole transport pattern 247, and the hole injection pattern 248, and the structure of the first light-emitting functional pattern 243 is not limited thereto.

Film layers in the first light-emitting device 24 and film layers in the second light-emitting device 25 may all be transparent film layers. Alternatively, a part of the film layers in the first light-emitting device 24 and a part of the film layers in the second light-emitting device 25 may be translucent film layers, and a remaining part of the film layers in the first light-emitting device 24 and a remaining part of the film layers in the second light-emitting device 25 may be transparent film layers.

Figure 3D:
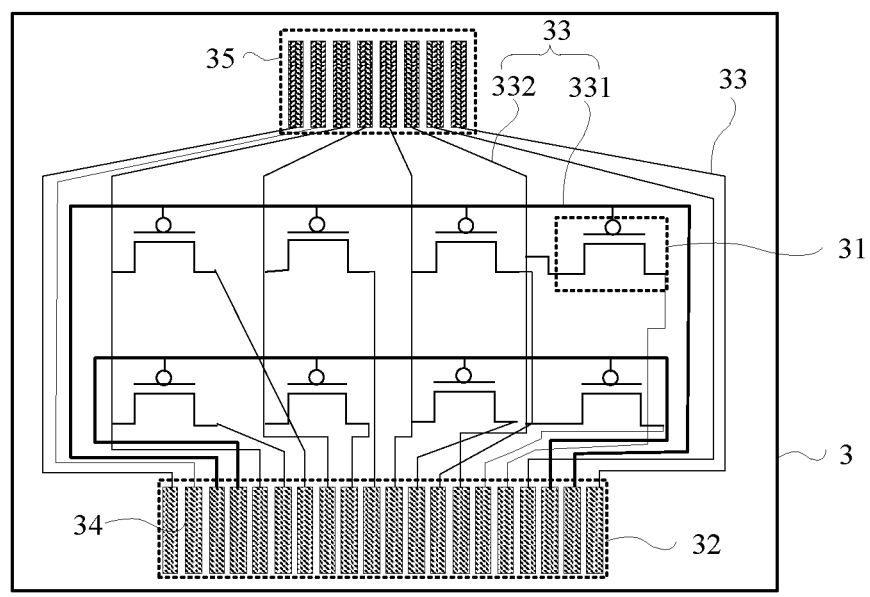
FIG. 3D is a top structural view of a driving panel, in accordance with some embodiments of the present disclosure.

With reference to FIGS. 3A and 3D, the driving panel 3 includes second pixel driving circuits 31, the second pixel driving circuit 31 is coupled to a second light-emitting device 25 and configured to drive the second light-emitting device 25 to emit light.

The structure of the second pixel driving circuit 31 is the same as the structure of the first pixel driving circuit 21. As for the second pixel driving circuit 31, reference may be made to the description of the first pixel driving circuit 21 above, and details will not be repeated here.

Figure 6A:
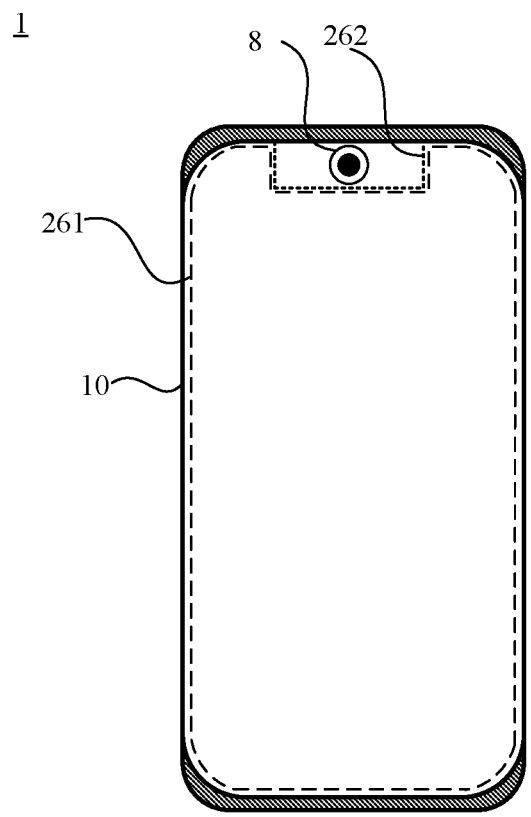
FIG. 6A is a top structural view of a display panel in the related art.
Figure 6B:
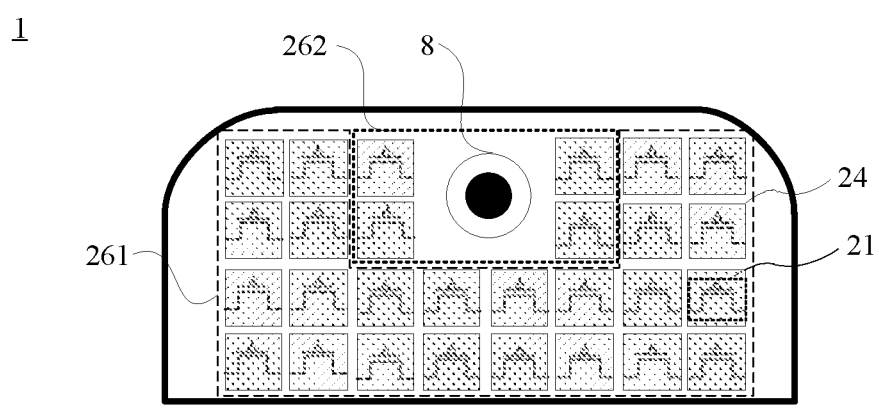
FIG. 6B is a top structural view of another display panel in the related art.

In the related art, with reference to FIGS. 6A and 6B, a display apparatus 1 includes a display panel 2 and sensor(s). For example, the display panel 2 is a full-screen display panel, the sensor is a camera, and the camera is a front camera 8. In order to further increase a screen-to-body ratio of the display panel 2, it has become a current mainstream trend to hide the front camera 8 on a non-light-exit side of the display panel 2. Based on this, the display panel 2, for example, has at least a first display region 261 and a second display region 262. The second display region 262 is, for example, in a shape of a rectangle. The first display region 261 is disposed on three sides of the second display region 262. The front camera 8 is disposed on the non-light-exit side of the display panel 2, and an orthographic projection of the front camera 8 on the display panel 2 is located in the second display region 262. The display panel 2 includes pixel driving circuits and light-emitting devices that are disposed in the first display region 261, and pixel driving circuits and light-emitting devices that are disposed in the second display region 262. The pixel driving circuits and the light-emitting devices that are located in the second display region are disposed on a periphery of the orthographic projection of the front camera 8 on the second display region 262. When the front camera 8 takes a picture, a region of the second display region 262 corresponding to the front camera 8 needs to have a high transmittance for ambient light. Therefore, in order to ensure normal operation of the front camera 8, no pixel driving circuit and no light-emitting device will be arranged in a position of the second display region 262 where the orthographic projection of the front camera 8 is located (i.e., a region of the second display region 262 corresponding to the front camera 8). In this way, it is possible to prevent the pixel driving circuits and the light-emitting devices form blocking ambient light entering the front camera 8. That is, in the second display region 262, except that the region corresponding to the front camera 8 has the high transmittance for the ambient light, a remaining region that is provided with the pixel driving circuits therein has a low transmittance for the ambient light. As a result, the entire second display region 262 has a low transmittance for the ambient light. The structure in the related art may ensure the normal operation of the front camera 8. However, on the one hand, the light transmittance of the second display region 262 is low, especially the position and the number of the pixel driving circuits in the second display region 262 limit the size of the front camera 8, the arrangement position of the front camera 8 and the number of the front camera(s) 8, and thus there are many limitations on the front camera 8, which is not conducive to manufacturing the display apparatus 1 and reducing production cost of the display apparatus 1. On the other hand, a pixel density of the second display region 262 is reduced, such that the pixel density of the second display region 262 is much less than a pixel density of the first display region 261. In a case where there is a large difference between the pixel density of the first display region 261 and the pixel density of the second display region 262, mura (uneven brightness) will appear on the display panel 2 during display, which influences a display effect of the display panel 2 and results in poor visual experience for the user.

It may be understood by those skilled in the art that, although the light-emitting devices may block the ambient light, the amount of the ambient light blocked by the light-emitting devices is small, which will not cause the front camera 8 not to operate normally. However, since the pixel driving circuits each include multiple layers, especially metal layers, the overall light transmittance of the region where the pixel driving circuits is located is low. In the related art, since orthographic projections of the light-emitting devices on a substrate of the display panel respectively overlap with orthographic projections of the pixel driving circuits on the substrate, the pixel driving circuits cannot be provided in the region, corresponding to the front camera 8, in the second display region 262. Once the pixel driving circuits are provided in this region, the front camera 8 will fail to receive light and operate normally.

In the embodiment of the present disclosure, the display assembly 10 includes the display panel 2 and the driving panel 3. The display panel 2 includes the second light-emitting devices 25 disposed in the second display region 262. The driving panel 3 includes the second pixel driving circuits 31. The second pixel driving circuit 31 is coupled to the second light-emitting device 25, and configured to drive the second light-emitting device 25 to emit light. A light transmittance of the second pixel driving circuits 31 is poor. Therefore, in order to prevent the second pixel driving circuits 31 from affecting the light transmittance of the second display region 262, the second pixel driving circuits 31 are disposed in the driving panel 3, and only the second light-emitting devices 25 are disposed in the second display region 262. In a case where the second pixel driving circuits 31 are disposed in the driving panel 3, the light transmittance of the second display region 262 is greater than the light transmittance of the second display region 262 in the related art. As a result, in a case where the front camera 8 is arranged on the non-light exit side of the display assembly 10, there are less limitations of the second display region 262 on the size of the front camera 8, the arrangement position of the front camera 8 and the number of the front cameras 8, which is conducive to manufacturing the display apparatus 1 and reducing the production cost of the display apparatus 1.

In some embodiments, with reference to FIGS. 3A to 3C, the display panel 2 further includes a first bonding portion 22 located in the non-display region 27. With reference to FIGS. 3A and 3D, the driving panel 3 further includes a second bonding portion 32. With reference to FIG. 3A, the display panel 2 and the driving panel 3 are coupled together through the first bonding portion 22 and the second bonding portion 32.

The second pixel driving circuits 31 disposed in the driving panel 3 needs to drive the second light-emitting devices 25 disposed in the display panel 2 to emit light. Therefore, the display panel 2 may be bonded to the driving panel 3 through the first bonding portion 22 and the second bonding portion 32, so that the second pixel driving circuits 31 are each coupled to the second light-emitting device.

Based on the above description, with reference to FIGS. 1A to 1H, the display panel 2 is coupled to the driving panel 3 through the conductive medium. It may be understood by a person skilled in the art that, the coupling between the display panel 2 and the driving panel 3 may be realized by coupling the first bonding portion 22 in the display panel 2 to the second bonding portion 32 in the driving panel 3 through the conductive medium. The conductive medium may be, for example, conductive adhesive or solder, and the first bonding portion 22 and the second bonding portion 32 may also be understood as pads.

Based on this, in some embodiments, with reference to FIGS. 3A to 3C, the first bonding portion 22 includes a plurality of first bonding pads 29. With reference to FIGS. 3A and 3D, the second bonding portion 32 includes a plurality of second bonding pads 34.

With reference to FIG. 3A, the plurality of first bonding pads 29 are directly coupled to the plurality of second bonding pads 34.

For example, in FIG. 3A, the number of the plurality of first bonding pads 29 is equal to the number of the plurality of second bonding pads 34, and the plurality of first bonding pads 29 are coupled to the plurality of second bonding pads 34 in one-to-one correspondence.

In some other embodiments, the number of the plurality of first bonding pads 29 is not equal to the number of the plurality of second bonding pads 34.

Both the first bonding pads 29 and the second bonding pads 34 may be referred to as bonding pads. A material of the bonding pads is, for example, a conductive material such as a metal material, and the metal material is, for example, aluminum (Al).

In a case where the plurality of first bonding pads 29 are directly coupled to the plurality of second bonding pads 34, the display panel 2 is directly coupled to the driving panel 3, which may, for example, refer to the coupling between the display panel 2 and the driving panel 3 shown in FIGS. 1A to 1H and FIGS. 2A to 2D.

In some other embodiments, the plurality of first bonding pads 29 are coupled to the plurality of second bonding pads 34 through the FPC 6.

With reference to FIGS. 2E to 2J, the plurality of first bonding pads 29 are coupled to the plurality of second bonding pads 34 through the FPC 6, so that the display panel 2 is coupled to the driving panel 3 through the FPC 6.

The FPC 6 is a highly reliable and excellent flexible printed circuit board made of a polyimide film or a polyester film as a base material, and the FPC 6 has advantages of high wiring density, light weight and small thickness. Therefore, on the one hand, it is convenient to realize coupling between the FPC 6 and the display panel 2, and coupling between the FPC 6 and the driving panel 3, so that signals transmitted by the driving panel 3 may be transmitted to the display panel 2 through the FPC 6. On the other hand, because of the small thickness of the FPC 6, it is conducive to providing a second transparent region or a second through hole 61 therein, so as to ensure that the front camera 8 may take a picture normally through the second transparent region or the second through hole 61.

It will be noted that, although the first bonding pads 29 are coupled to the second bonding pads 34 through the conductive medium, or with reference to FIGS. 1A to 1H and 2A to 2D, although the display panel 2 is coupled to the driving panel 3 also through the conductive medium, the coupling of these structures should be understood as directly coupling. It is because that in a case where two independent panels are coupled, the conductive medium is necessarily needed to achieve the coupling. The terms "directly coupled" and "indirectly coupled" in the embodiments of the present disclosure are only used to distinguish whether there are any electrical elements other than the conductive medium, such as the FPC 6, between the display panel 2 and the driving panel 3. Therefore, in a case where the display panel 2 is coupled to the driving panel 3 through the FPC 6, it should be understood as indirectly coupling. In a case where the display panel 2 is coupled to the driving panel 3 not through the FPC 6, it should be understood as directly coupling.

In some embodiments, with reference to FIGS. 3A to 3C, the display panel 2 further includes first connecting lines 28, and at least a portion of each first connecting line 28 is located in the second display region 262. The first connecting line 28 is configured to couple the second light-emitting device 25 to the second pixel driving circuit 31.

For example, a material of the first connecting line 28 is a conductive material, and the first connecting line 28 has, for example, a single-layer structure.

For example, with reference to FIGS. 3A to 3C, one end of the first connecting line 28 is coupled to a first electrode of the second light-emitting device 25, and the other end of the first connecting line 28 is coupled to the first bonding pad 29 in the first bonding portion 22. In order to realize the coupling between the first connecting line 28 and the first electrode of the second light-emitting device 25, for example, a connecting hole 2410 may be provided on the first electrode of the second light-emitting device 25. In this way, when the first connecting line 28 is formed, the material of the first connecting line 28 may be filled into the connecting hole 2410.

Since the second pixel driving circuit 31 is disposed in the driving panel 3 and the second light-emitting device 25 is disposed in the display panel 2, signal terminals of the second light-emitting device 25 need to be led to the first bonding portion 22 through the first connecting lines 28. In this way, the first bonding portion 22 receives signals transmitted by the driving panel 3 through the second bonding portion 32 subsequently.

Based on this, in some embodiments, a material of a portion of the first connecting line 28 located in the second display region 262 is a transparent conductive material.

The transparent conductive material is, for example, indium tin oxide (ITO). The higher the light transmittance of the second display region 262 is, the more the ambient light enters the front camera 8 through the second display region 262. Therefore, the first connecting line 28 made of the transparent conductive material may further improve the light transmittance of the second display region 262.

In some embodiments, the display panel 2 includes the first bonding portion 22 and the driving panel 3 includes the second bonding portion 32.

With reference to FIGS. 3A to 3C, the display panel 2 further includes a plurality of first signal lines 23. The plurality of first signal lines 23 are each coupled to first pixel driving circuits 21 and the first bonding portion 22, and configured to provide a driving signal for the first pixel driving circuits 21.

For example, with reference to FIG. 4A, in a case where the first pixel driving circuits 21 are of the 7T1C-type structure, the first signal lines 23 are, for example, configured to provide, for the first pixel driving circuits 21, the first power supply voltage signal, the second power supply voltage signal, the data signal the initialization signal and scanning signals. The scanning signals include the gate driving signal, the reset signal and the light-emitting control signal. Furthermore, the first signal lines 23 include power supply voltage signal lines for providing the first power supply voltage signal and the second power supply voltage signal, a data signal line for providing the data signal, an initialization signal line for providing the initialization signal, a gate line for providing the gate driving signal, a reset signal line for providing the reset signal, and a light-emitting control signal line for providing the light-emitting control signal.

For another example, with reference to FIG. 4B, in a case where the first pixel driving circuits 21 are of the 2T1C-type structure, the first signal lines 23 are, for example, configured to provide, for the first pixel driving circuits 21, the first power supply voltage signal, the second power supply voltage signal, the data signal and the gate driving signal. Furthermore, the first signal lines 23 include power supply voltage signal lines for providing the first power supply voltage signal and the second power supply voltage signal, a data signal line for providing the data signal, and a gate line for providing the gate driving signal.

With reference to FIGS. 3A and 3D, the driving panel 3 further includes a plurality of second signal lines 33. Some of the plurality of second signal lines 33 are each coupled to the second pixel driving circuits 31 and the second bonding portion 32, and configured to provide a driving signal for the second pixel driving circuits 31.

Similarly, in the case where the second pixel driving circuits 31 are of the 7T1C-type structure, the second signal lines 33 are, for example, configured to provide, for the second pixel driving circuits 31, the first power supply voltage signal, the second power supply voltage signal, the data signal, the initialization signal and scanning signals. The scanning signals include the gate driving signal, the reset signal and the light-emitting control signal. Furthermore, the second signal lines 33 include power supply voltage signal lines for providing the first power supply voltage signal and the second power supply voltage signal, a data signal line for providing the data signal, an initialization signal line for providing the initialization signal, a gate line for providing the gate driving signal, a reset signal line for providing the reset signal, and a light-emitting control signal line for providing the light-emitting control signal.

For another example, in the case where the second pixel driving circuits 31 are of the 2T1C-type structure, the second signal lines 33 are, for example, configured to provide, for the second pixel driving circuits 31, the first power supply voltage signal, the second power supply voltage signal, the data signal and the gate driving signal. Furthermore, the second signal lines 33 include power supply voltage signal lines for providing the first power supply voltage signal and the second power supply voltage signal, a data signal line for providing the data signal, and a gate line for providing the gate driving signal.

Materials of the first signal lines 23 and the second signal lines 33 are both a conductive material, such as a metal conductive material.

The first signal lines 23 are each coupled to the first pixel driving circuit 21 and the first bonding portion 22, so that various driving signals for driving the first pixel driving circuit 21 may be received through the first bonding portion 22.

Based on the above, in some embodiments, the first signal line 23 is coupled to the second signal line 33. Since the first signal line 23 is coupled to the first bonding portion 22 and the second signal line 33 is coupled to the second bonding portion 32, the first signal line 23 and the second signal line 33 may be coupled together through the first bonding portion 22 and the second bonding portion 32. As a result, except that special data signals are not necessarily the same, signals received by the first pixel driving circuit 21 and the second pixel driving circuit 31 are the same, which may reduce the number of the driving signals in the display apparatus 1.

In the above embodiments, the first pixel driving circuit 21 and the second pixel driving circuit 31 are considered to have the same structure for description. Therefore, after the first signal line 23 is coupled to the second signal line 33, the driving signals received by the first pixel driving circuit 21 and the driving signals received by the second pixel driving circuit 31 are mostly the same. That is, the first power supply voltage signal, the second power supply voltage signal, the initialization signal, and the scanning signals received by the first pixel driving circuit 21 are exactly the same as the first power supply voltage signal, the second power supply voltage signal, the initialization signal, and the scanning signals received by the second pixel driving circuit 31, thereby reducing the number of the driving signals. Because of the specificity of the data signals, whether the data signals received by the first pixel driving circuit 21 and by the second pixel driving circuit 31 are the same depends on whether the first light-emitting device 24 driven by the first pixel driving circuit 21 and the second light-emitting device 25 driven by the second pixel driving circuit 31 are located in a same column. Therefore, the first signal line 23 is to coupled to the second signal line 33, it may be possible to ensure that when the first pixel driving circuit 21 and the second pixel driving circuit 31 need to receive the same driving signals, the driving signals received by the first pixel driving circuit 21 and by the second pixel driving circuit 31 are substantially the same.

Figure 7A:
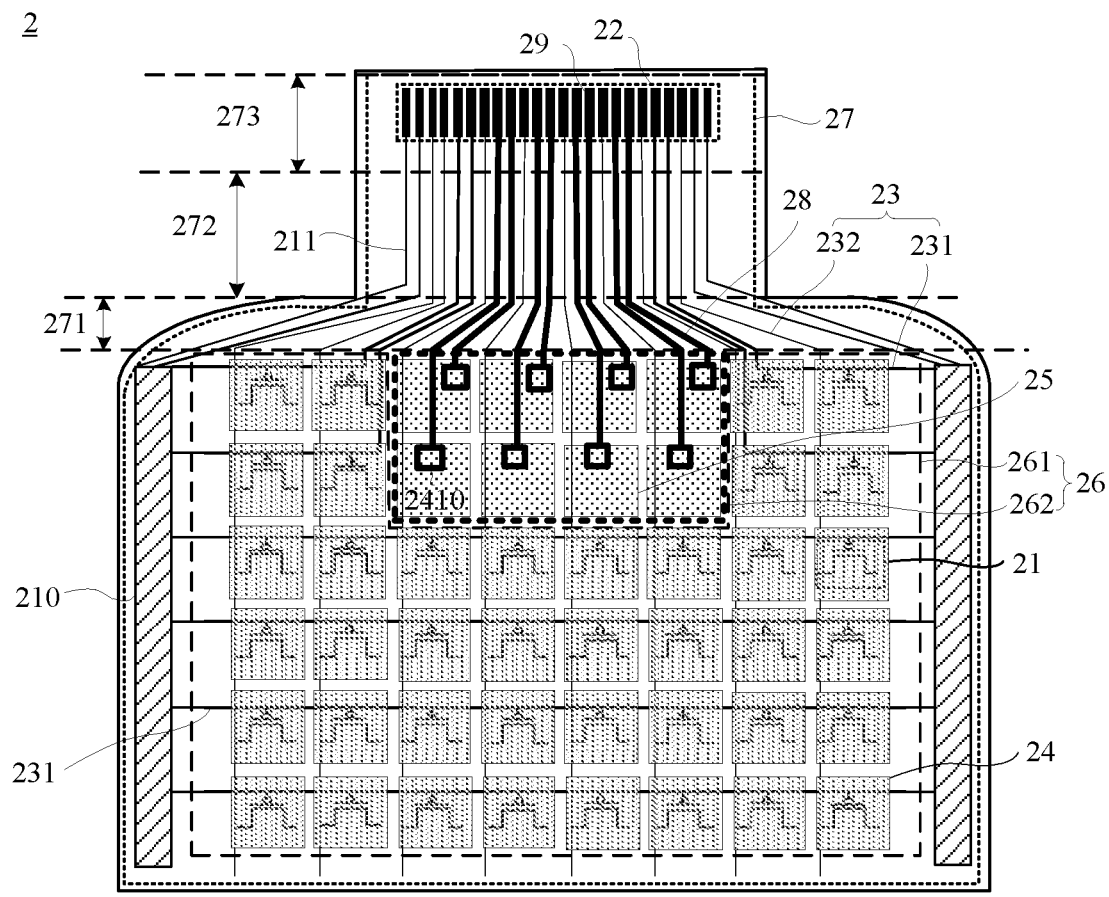
FIG. 7A is a top structural view of yet another display panel, in accordance with some embodiments of the present disclosure.

In some embodiments, with reference to FIG. 7A, the display panel 2 further includes a plurality of third signal lines 211 and at least one gate driving circuit 210. The plurality of third signal lines 211 are coupled to the gate driving circuit 210 and the first bonding portion 22, and the plurality of third signal lines 211 are configured to provide the driving signals for the gate driving circuit 210. The gate driving circuit 210 is configured to provide the scanning signals for a part of the first signal lines 23.

The first signal lines 23 include various types of signal lines, and the scanning signals are only provided by a part of the first signal lines 23. First signal lines 23 that may provide the scanning signals in the first signal lines 23 include, for example, the gate lines, the light-emitting control signal lines and the reset signal lines. Alternatively, in some other embodiments, first signal lines 23 that may provide the scanning signals in first signal lines 23 only include the gate lines. An end of the first signal line 23 for providing the scanning signal in the first signal lines 23 is coupled to an output signal terminal of the gate driving circuit 210, so as to receive the scanning signal output by the gate driving circuit 210.

Figure 7B:
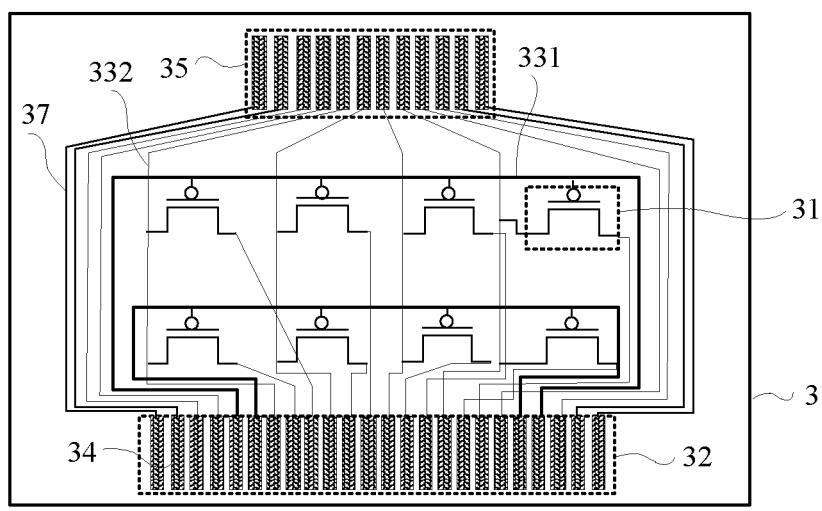
FIG. 7B and FIG. 7C are each a top structural view of another driving panel, in accordance with some embodiments of the present disclosure.

With reference to FIGS. 7A and 7B, the driving panel 3 further includes second connecting lines 37. The second connecting lines 37 are coupled to the plurality of third signal lines 211 respectively through the second bonding portion 32 and the first bonding portion 22. That is, each second connecting line 37 is coupled to a respective third signal line 211 through the second bonding portion 32 and the first bonding portion 22. The second connecting line 37 functions as a lead.

With reference to FIGS. 1A to 1H and 2A to 2J, the display apparatus 1 further includes the driving chip 4, and the driving chip 4 is coupled to the driving panel 3.

For example, with reference to FIGS. 1A to 1H and 2E to 2H, the driving chip 4 is directly coupled to the driving panel 3. That is, the driving chip 4 is coupled to the driving panel 3 only through the conductive medium.

For another example, with reference to FIGS. 2A to 2D, the driving chip 4 is coupled to the driving panel 3 through the FPC 6.

For yet another example, with reference to FIGS. 2I to 2L, the driving chip 4 is coupled to the driving panel 3 through a chip on film (COF) 7. The COF 7 has high flexibility and is provided with a gold finger (which is a type of bonding pads) therein, so that the COF may be easily coupled to the driving panel 3 and the driving chip 4.

Since the driving panel 3 needs to be coupled to the driving chip 4, in some embodiments, the driving panel 3 is further provided with a third bonding portion 35 therein. For example, FIG. 3D and FIG. 7B show a position and a structure of the third bonding portion 35. For example, with reference to FIG. 1F, the third bonding portion 35 and the second bonding portion 32 may be located on the same side of the driving panel 3. Alternatively, with reference to FIG. 1D, the third bonding portion 35 and the second bonding portion 32 may be located on different sides of the driving panel.

The driving chip 4 may include, for example, a source driver, a timing controller, and other devices that may provide the driving signals for the display apparatus 1.

With reference to FIGS. 1A to 1H and FIGS. 2A to 2L, the signals received by the display panel 2 and the driving panel 3 are all from the driving chip 4. The driving chip 4 is configured to provide, for the display assembly 10, various driving signals required by the display assembly 10. The various driving signals are, for example, the power supply voltage signal, the power supply voltage signal, the data signal, and the initialization signal required by the first pixel driving circuit 21 and the second pixel driving circuit 31, and clock signal(s), an input signal and the like required by the gate driving circuit 210. The first signal lines 23, the second signal lines 33, the third signal lines 211 and the second connecting lines 37 all function to transmit the various driving signals, so that the signals output by the driving chip 4 may be transmitted to the first pixel driving circuits 21, the second pixel driving circuits 31 and the gate driving circuit(s) 210.

Figure 8:
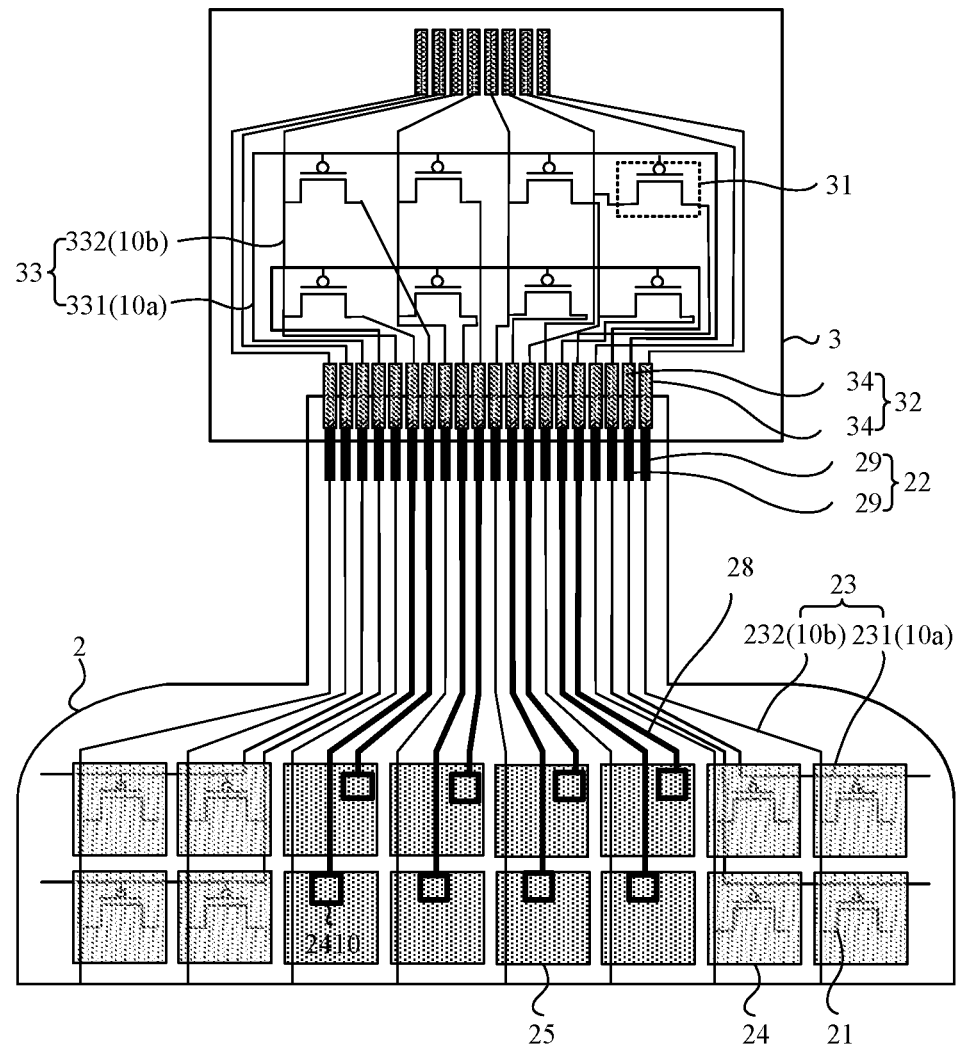
FIG. 8 is a top structural view of another display assembly, in accordance with some embodiments of the present disclosure.

In some embodiments, with reference to FIG. 8, the plurality of first signal lines 23 include first scanning signal lines 231 and first data signal lines 232. The plurality of second signal lines 33 include second scanning signal lines 331 and second data signal lines 332. The first scanning signal lines 231 and the second scanning signal lines 331 are coupled respectively to be scanning signal lines 10a, and the first data signal lines 232 and the second data signal lines 332 are coupled respectively to be data signal lines 10b. That is, each first scanning signal line 231 and a respective second scanning signal line 331 are coupled to be a scanning signal line 10a, and each first data signal line 232 and a respective second data signal line 332 are coupled to be a data signal line 10b.

The scanning signal line is coupled to first pixel driving circuits 21 and second pixel driving circuits 31 that are respectively coupled to first light-emitting devices 24 and second light-emitting devices 25, for emitting light simultaneously, in a same row.

The data signal line is coupled to first pixel driving circuits 21 and second pixel driving circuits 31 that are respectively coupled to first light-emitting devices 24 and second light-emitting devices 25 in a same column. First light-emitting devices 24 and second light-emitting devices 25 in a column consist of light-emitting devices with same orders in all rows of light-emitting devices. A part of the rows of light-emitting devices each include first light-emitting devices 24 and second light-emitting devices 25.

With reference to FIG. 8, the first light-emitting devices 24 and the second light-emitting devices 25 are arranged in an array of rows by columns. The display panel 2 performs scanning row-by-row during display, and the first light-emitting devices 24 and the second light-emitting devices 25 that are located in the same row need to emit light simultaneously. Therefore, the first pixel driving circuits 21 each coupled to the first light-emitting device 24 and the second pixel driving circuits 31 each coupled to the second light-emitting device 25 in the same row as the first light-emitting device 24 need to be coupled to the same scanning signal line. The first pixel driving circuits 21 each coupled to the first light-emitting device 24 and the second pixel driving circuits 31 each coupled to the second light-emitting device 25 in the same column as the first light-emitting device 24 are coupled to the same data signal line. The scanning signal line is configured to provide the scanning signal for the first pixel driving circuits 21 and the second pixel driving circuits 31, and the data signal line is configured to provide the data signal for the first pixel driving circuits 21 and the second pixel driving circuits 31.

With reference to FIG. 8, although in the figure, the first light-emitting devices 24 and the second light-emitting devices 25 in the display panel 2 are arranged in the array of rows by columns, the first light-emitting devices 24 and the second light-emitting devices 25 are not limited to be arranged in the array in the embodiments of the present disclosure, and may not be arranged in the array. In a case where the first light-emitting devices 24 and the second light-emitting devices 25 are not arranged in the array, first light-emitting devices 24 and second light-emitting devices 25 that emit light simultaneously may be regarded as being in the same row. Similarly, in a case where the first light-emitting devices 24 and the second light-emitting devices 25 are arranged in the array or not arranged in the array, the first light-emitting devices 24 and the light-emitting devices 25 in the same column have the same orders in the rows of light-emitting devices (including the light-emitting devices 24 and the second light-emitting devices 25).

It may be understood by a person skilled in the art that, the above only describes rows and columns, only involving the first light-emitting devices 24 and the second light-emitting devices 25, in the display panel 2, and the display panel 2 further includes rows and columns in which only the first light-emitting devices 24 are located.

Although the above only describes the scanning signal lines and the data signal lines formed after the display panel 2 is coupled to the driving panel 3, as for the coupling between remaining first signal lines 23 in the first signal lines 23 other than both the first scanning signal lines 231 and the first data signal lines 232 and remaining second signal lines 33 in the second signal lines 33 other than both the second scanning signal lines 331 and the second data signal lines 332, reference may be made to the above coupling manners of the scanning signal lines and the data signal lines. For example, a first signal line 23 in the display panel 2 and a second signal line 33 in the driving panel 3 are coupled to form a power supply voltage signal line for providing the first power supply voltage signal or a power supply voltage signal line for providing the second power supply voltage signal. Therefore, the coupling manner is not repeated.

In some embodiments, with reference to FIGS. 3A to 3C, the non-display region 27 includes a first non-display region 271, a bendable region 272, and a second non-display region 273 that are sequentially away from the display region 26. In a case where the display panel 2 further includes the first bonding portion 22, the first bonding portion 22 is located in the second non-display region 273.

The bendable region 272 is located between the first non-display region 271 and the second non-display region 273. A portion of the display panel 2 located in the bendable region 272 is configured to bend a portion thereof located in the second non-display region 273 to the non-light exit side of the display panel 2.

The portion of the display panel 2 located in the bendable region 272 may be bent, so that the first bonding portion 22 is folded to the non-light exit side of the display panel 2. In this way, a width of a bezel of the display panel 2 may be reduced, and the display panel 2 has a beautiful overall shape.

In some embodiments, the display panel 2 includes the first scanning signal lines 231 and the first connecting lines 28.

Figure 9A:
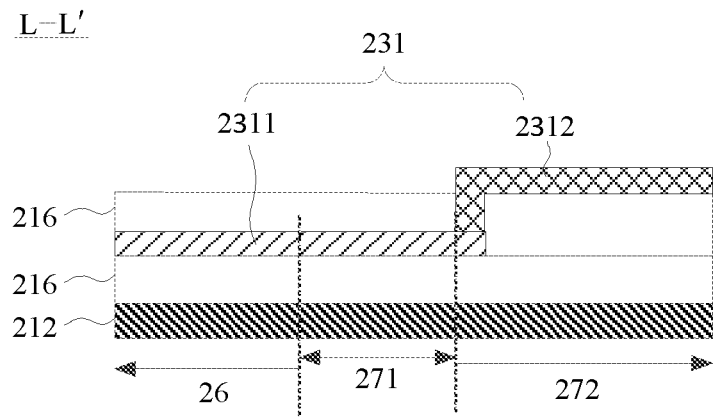
FIG. 9A to FIG. 9F are each a longitudinal sectional view of the display panel in FIG. 3B taken along the L-L' direction.

FIG. 9A is a longitudinal sectional view of the display panel 2 taken along a length direction (L-L'). The first scanning signal line 231 includes a first scanning sub-pattern 2311 and a second scanning sub-pattern 2312. The first scanning sub-pattern 2311 is located in the display region 26 and the first non-display region 271, the second scanning sub-pattern 2312 is located in the bendable region 272 and the second non-display region 273, and a conductivity of the second scanning sub-pattern 2312 is greater than a conductivity of the first scanning sub-pattern 2311.

The first scanning sub-pattern 2311 is formed from, for example, a gate metal layer. The gate metal layer may be, for example, a first gate metal layer or a second gate metal layer. The first gate metal layer is used for forming the gate of the thin film transistor, both the gate line and the reset signal line in the pixel driving circuit, and on the like. The second gate metal layer is used, for example, for forming an electrode plate of the capacitor in the pixel driving circuit, the initialization signal line, and on the like. Materials of the first gate metal layer and the second gate metal layer may be the same or different. In the embodiments of the present disclosure, the first gate metal layer and the second gate metal layer being both made of molybdenum (Mo) are considered as an example for illustration.

In a case where the display panel 2 only includes the first metal layer, the second scanning sub-pattern 2312 is formed from, for example, the first metal layer. The first metal layer is used for forming the first electrode and the second electrode of the thin film transistor, both the power supply voltage signal line and the data signal line in the pixel driving circuit, and the like. The material of the first metal layer includes, for example, aluminum (Al) and titanium (Ti). The first metal layer has, for example, a stacked structure, such as a three-layer stacked structure of Ti\Al\Ti.

Figure 9B:
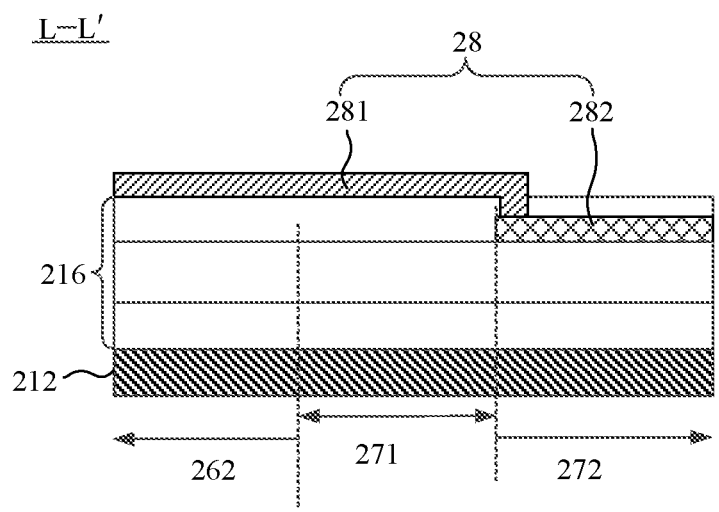

With reference to FIG. 9B, the first connecting line 28 extends from the second display region 262 to the second non-display region 273. The first connecting line 28 includes a first connecting sub-pattern 281 and a second connecting sub-pattern 282. The first connecting sub-pattern 281 is located in the second display region 262 and the first non-display region 271, the second connecting sub-pattern 282 is located in the bendable region 272 and the second non-display region 273, and a conductivity of the second connecting sub-pattern 282 is greater than a conductivity of the first connecting sub-pattern 281.

Since the first connecting sub-pattern 281 is located in the second display region 262, and the second display region 262 needs the high light transmittance, a material of the first connecting sub-pattern 281 is, for example, a transparent material, such as ITO. The second connecting sub-pattern 282 is formed from, for example, the first metal layer. The conductivity of the second connecting sub-pattern 282 is greater than the conductivity of the first connecting sub-pattern 281, which is conducive to improving the conductivity of the entire first connecting line 28. Moreover, a flexibility of the second connecting sub-pattern 282 is greater than a flexibility of the first connecting sub-pattern 281, so that the portion of the display panel 2 located in the bendable region 272 may be bent.

It can be understood by a person skilled in the art that a conductivity of ITO is lower than a conductivity of the metal material. Therefore, in a case where the second connecting sub-pattern 282 is formed from the first metal layer, the conductivity of the entire first connecting line 28 may increase, and loss of the signal transmitted by the first connecting line 28 may be reduced.

The portion of the display panel 2 located in the bendable region 272 needs to be bent, and the second scanning sub-pattern 2312 and the second connecting sub-pattern 282 are both located in the bendable region 272. Therefore, in order to ensure that the portion of the display panel 2 located in the bendable region 272 may be bent normally, the portion of the second scanning sub-pattern 2312 located in the bendable region 272 and the portion of the second connecting sub-pattern 282 located in the bendable region 272 need to have high flexibility. In the embodiments of the present disclosure, the second scanning sub-pattern 2312 and the second connecting sub-pattern 282 are formed from the first metal layer, so as to improve the flexibility of the portion of the display panel 2 located in the bendable region 272, so that a portion of the display assembly 10 located in the bendable region 272 may be bent.

In some embodiments, the display panel 2 includes the first data signal lines.

Figure 9C:
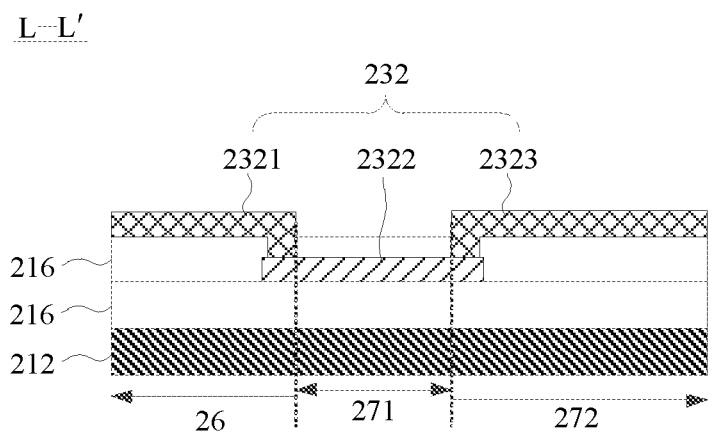

With reference to FIG. 9C, the first data signal line 232 includes a first data sub-pattern 2321, a second data sub-pattern 2322 and a third data sub-pattern 2323. The first data sub-pattern 2321 is located in the display region 26, the second data sub-pattern 2322 is located in the first non-display region 271, and the third data sub-pattern 2323 is to located in the bendable region 272 and the second non-display region 273. The second data sub-pattern 2322 is disposed in a different layer from the first data sub-pattern 2321 and the third data sub-pattern 2323, and the first data sub-pattern 2321 and the third data sub-pattern 2323 are disposed in the same layer and made of the same material.

The first data sub-pattern 2321 and third data sub-pattern 2323 are made from, for example, the first metal layer, and the second data sub-pattern 2322 is made from, for example, the gate metal layer. Therefore, the second data sub-pattern 2322 is disposed in a different layer from the first data sub-pattern 2321 and the third data sub-pattern 2323.

Figure 10A:
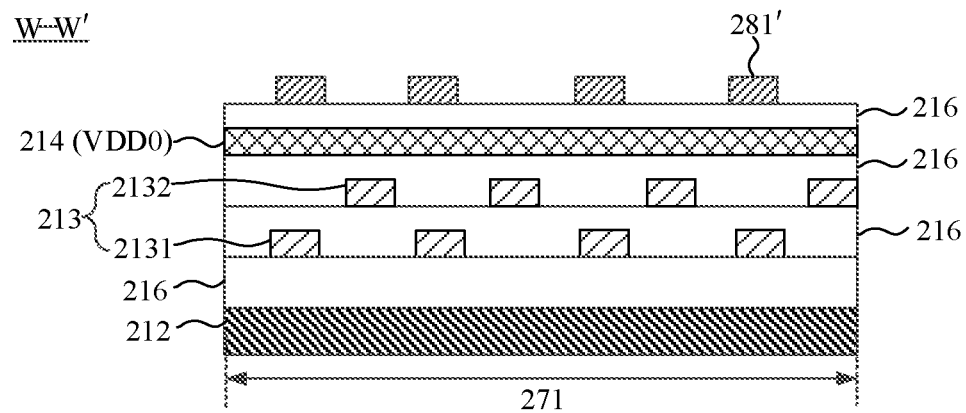
FIG. 10A to FIG. 10B are each a longitudinal sectional view of the display panel in FIG. 3B taken along the W-W' direction.

With reference to FIG. 10A, the power supply voltage signal line VDD0 for providing the first power supply voltage signal in the first pixel driving circuit 21 penetrates the first non-display region 271 in the W-W direction, and the power supply voltage signal line VDD0 and the first data sub-pattern 2321 are both made from a first metal layer 214. As a result, the first data sub-pattern 2321 cannot extend from the display region 26 into the first non-display region 271 due to existence of the power supply voltage signal line. Therefore, the second data sub-pattern 2322 located on a lower side of the first data sub-pattern 2321 is needed to be arranged, so as to realize the coupling between the first data sub-pattern 2321 and the third data sub-pattern 2323.

In some other embodiments, a conductivity of the first data sub-pattern 2321 is greater than a conductivity of the second data sub-pattern 2322.

The second data sub-pattern 2322 is formed from the gate metal layer 213, the first data sub-pattern 2321 is formed from the first metal layer 214, and a conductivity of the first metal layer 214 is greater than a conductivity of the gate metal layer 213. Therefore, the conductivity of the first data sub-pattern 2321 is greater than the conductivity of the second data sub-pattern 2322.

Figure 9D:
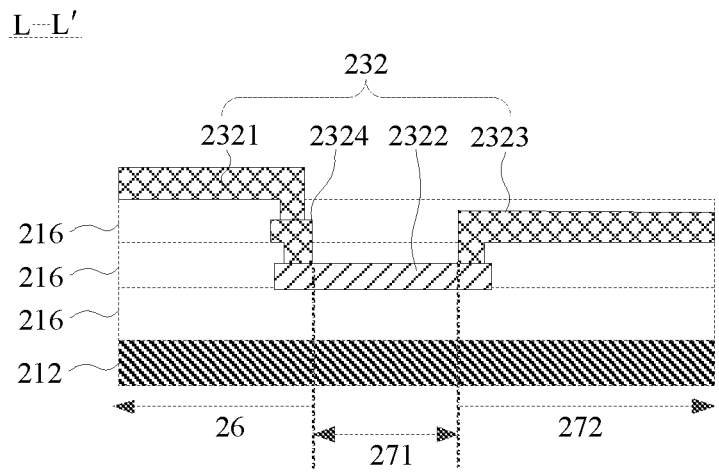

In some embodiments, in a case where the display panel 2 includes the first metal layer 214 and the second metal layer, as shown in FIG. 9D, the first data signal line 232 further includes a fourth data sub-pattern 2324, and the fourth data sub-pattern 2324 is configured to couple the first data sub-pattern 2321 to the second data sub-pattern 2322. The function of the second metal layer is the same as the function of the first metal layer 214, and the second metal layer is located on an upper side of the first metal layer 214.

Figure 10B:
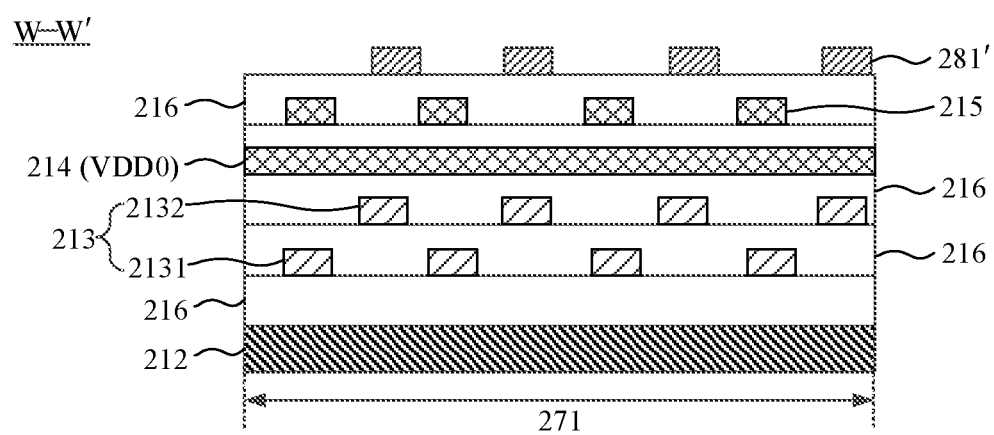

With reference to FIG. 10A, in a case where the display assembly 10 only includes the first metal layer 214, the data signal line, the power supply voltage signal line and on the like in the display assembly 10 are each of a single-layer structure. With reference to FIG. 10B, in a case where the display assembly 10 includes the first metal layer 214 and the second metal layer 215, the data signal line and the power supply voltage signal line in the display assembly 10 are each of a bilayer structure. The lines with the bilayer structure may make widths of the data signal lines and the power supply voltage signal lines large, so as to reduce resistances of the data signal lines and the power supply voltage signal lines and reduce loss of the signals transmitted by these signal lines.

It can be understood by a person skilled in the art that, the power supply voltage signal line for providing the second power supply voltage signal is disposed above the power supply voltage signal line VDD0 for providing the first power supply voltage signal and may be located in the whole display region 26, and the power supply voltage signal line for providing the second power supply voltage signal is not formed from the first metal layer 214.

With reference to FIG. 9D, the display assembly 10 has the bilayer wiring structure. The first data sub-pattern 2321 is coupled to the fourth data sub-pattern 2324, the fourth data sub-pattern 2324 is coupled to the second data sub-pattern 2322, and the second data sub-pattern 2322 is coupled to the third data sub-pattern 2323. The first data sub-pattern 2321 is formed from, for example, the second metal layer 215. The third data sub-pattern 2323 may be formed from, for example, any one of the first metal layer 214 and the second metal layer 215. The fourth data sub-pattern 2324 is formed from, for example, the first metal layer 214. The second data sub-pattern 2322 is formed from, for example, the gate metal layer 213.

Figure 9E:
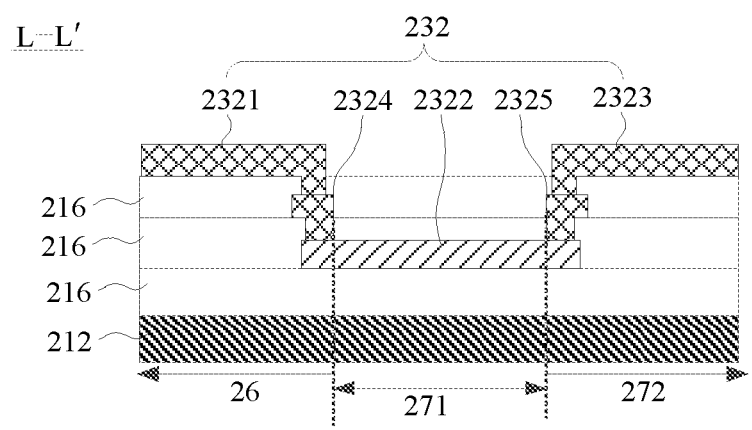

In some other embodiments, with reference to FIG. 9E, in the case where the display panel 2 includes the first metal layer 214 and the second metal layer 215, the first data signal line 232 further includes the fourth data sub-pattern 2324 and a fifth data sub-pattern 2325. The fourth data sub-pattern 2324 is configured to couple the first data sub-pattern 2321 to the second data sub-pattern 2322. The fifth data sub-pattern 2325 is configured to couple the second data sub-pattern 2322 to the third data sub-pattern 2323.

With reference to FIG. 9E, the display assembly 10 has the bilayer wiring structure. The first data sub-pattern 2321 is coupled to the fourth data sub-pattern 2324, the fourth data sub-pattern 2324 is coupled to the second data sub-pattern 2322, the second data sub-pattern 2322 is coupled to the fifth data sub-pattern 2325, and the fifth data sub-pattern 2325 is coupled to the third data sub-pattern 2323. The first data sub-pattern 2321 and the third data sub-pattern 2323 are formed from, for example, the second metal layer 215. The fourth data sub-pattern 2324 and the fifth data sub-pattern 2325 are formed from, for example, the first metal layer 214. The second data sub-pattern 2322 is formed from, for example, the gate metal layer 213.

Figure 9F:
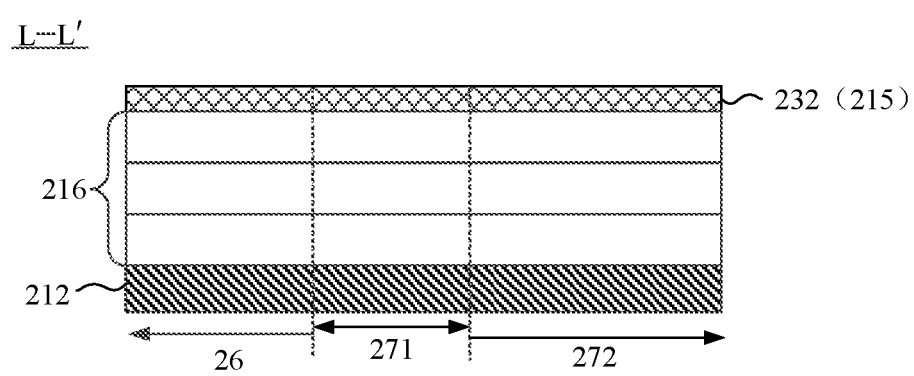

In the case where the display assembly 10 has the bilayer wiring structure, in some other embodiments, with reference to FIG. 9F, the entire first data signal line 232 may be formed from, for example, the second metal layer 215. In this structure, the power supply voltage signal line VDD0 may be formed from, for example, the first metal layer 214, and the first data signal line 232 may be formed from the second metal layer 215. Since the first data signal line 232 is disposed in a different layer from the power supply voltage signal line VDD0, the first data signal line 232 may directly extend from the display region 26 to the first non-display region 271 and the bendable region 272.

In the case where the display assembly 10 has the bilayer wiring structure, in some other embodiments, with reference to FIG. 9A, the second scanning sub-pattern 2312 may also be formed from, for example, the second metal layer 215.

In the case where the display assembly 10 has the bilayer wiring structure, in some other embodiments, with reference to FIG. 9B, the second connecting sub-pattern 282 may also be formed from, for example, the second metal layer 215.

In some embodiments, the second scanning sub-pattern 2312, the second connecting sub-pattern 282 and the third data sub-pattern 2323 are disposed in the same layer and made of the same material.

For example, in a case where the display assembly 10 has a single-layer wiring structure, the second scanning sub-pattern 2312, the second connecting sub-pattern 282 and the third data sub-pattern 2323 are formed from, for example, the first metal layer 214.

For another example, in the case where the display assembly 10 has the bilayer wiring structure, the second scanning sub-pattern 2312, the second connecting sub-pattern 282 and the third data sub-pattern 2323 are formed from, for example, the first metal layer 214 or the second metal layer 215.

In the above structure, portions of the first signal lines 23 located in the bendable region 272 are all disposed in the same layer and made of the same material. That is, the portions of the first signal lines 23 located in the bendable region 272 are all formed from the first metal layer 214 or the second metal layer 215.

The second scanning sub-pattern 2312, the second connecting sub-pattern 282 and the third data sub-pattern 2323 are formed from the first metal layer 214 or the second metal layer 215, so that the portions of the display panel 2 located in the bendable region 272 has high flexibility and the manufacturing process is simple.

In some embodiments, the second data sub-pattern 2322 and the first scanning sub-pattern 2311 are disposed in the same layer and made of the same material.

It may be known from the foregoing description that the second data sub-pattern 2322 may be formed from the first gate metal layer 2131 of the gate metal layer 213, or from the second gate metal layer 2132 of the gate metal layer 213, and the first scanning sub-pattern 2311 is formed from the first gate metal layer 2131. Therefore, in a case where the second data sub-pattern 2322 and the first scanning sub-pattern 2311 are disposed in the same layer and made of the same material, the second data sub-pattern 2322 is actually formed from the first gate metal layer 2131, and the manufacturing process is simple.

In some embodiments, in the width direction of the display panel 2 (i.e., in the W-W' direction in FIG. 3B), a longitudinal sectional view of the display panel 2 located in the first non-display region 271 is shown in FIGS. 10A and 10B. In the case where the display assembly 10 has the single-layer wiring structure, the sectional view of the display panel 2 is shown in FIG. 10A. In the case where the display assembly 10 has the bilayer wiring structure, the sectional view of the display panel 2 is shown in FIG. 10B.

With reference to FIG. 10A, in the thickness direction of the display panel 2, the display panel 2 sequentially includes the substrate 212, the first gate metal layer 2131, the second gate metal layer 2132, the first metal layer 214, and a first connecting line layer 281', and further includes insulating layers 216 each located between film layers that need to be insulated. The first connecting line layer 281' is configured to form a plurality of first connecting sub-patterns 281.

With reference to FIG. 10B, in the thickness direction of the display panel 2, the display panel 2 sequentially includes the substrate 212, the first gate metal layer 2131, the second gate metal layer 2132, the first metal layer 214, the second metal layer 215, and the first connecting line layer 281', and further includes insulating layers 216 each located between film layers that need to be insulated. The first connecting line layer 281' is configured to form the plurality of first connecting sub-patterns 281.

With reference to FIGS. 10A and 10B, a portion of the first metal layer 214 located in the first non-display region 271 is a portion of the power supply voltage signal line. Because of a large width of the power supply voltage signal line, other first signal line 23, such as the first data signal line 232, formed from the first metal layer 214 needs to be switched to another layer when being in the first non-display region 271 (i.e., the structure shown in FIGS. 9C to 9E), so as to avoid the position where the power supply voltage signal line is located.

In some embodiments, with reference to FIGS. 3A to 3C, a pixel density (pixels per inch, PPI) of the first light-emitting devices 24 may be equal to a pixel density of the second light-emitting devices 25.

For example, the PPI of the first light-emitting devices 24 and the PPI of the second light-emitting devices 25 are each in a range of, for example, 400 to 600.

With reference to FIG. 6B, in the related art, since the front camera 8 needs to occupy a relatively large region in the second display region 262, a difference between the PPI of the first display region 261 and the PPI of the second display region 262 is relatively large. The PPI of the first display region 261 is, for example, 400 to 600, and the PPI of the second display region 262 is, for example, 200. Therefore, the mura (unevenness brightness) phenomenon will appear on the display panel 2 during display, and the display effect of the display panel 2 is poor.

In the embodiments of the present disclosure, the PPI of the first light-emitting devices 24 and the PPI of the second light-emitting devices 25 may be set to be the same, for example, 600. As a result, there is no display difference between the first display region 261 and the second display region 262, and the display effect of the display panel 2 and the visual experience of the user may be improved.

Figure 7C:
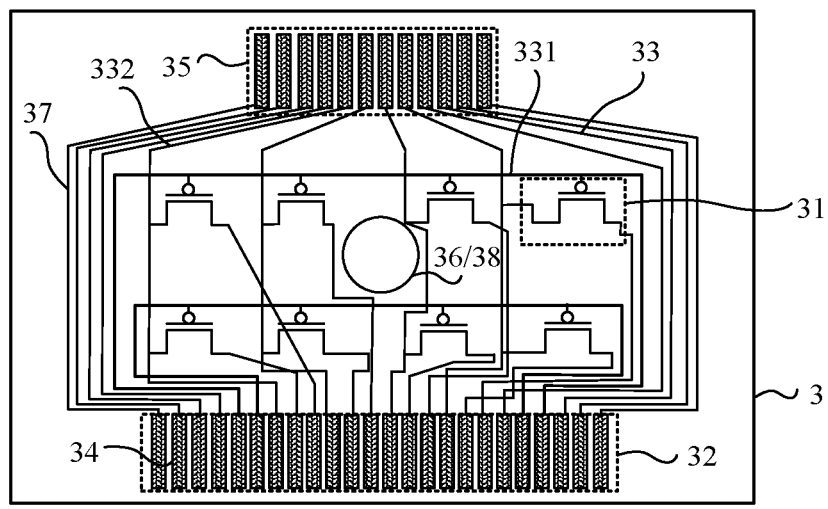

With reference to FIGS. 3D, 7B and 7C, the second signal lines 33 include the second scanning signal lines 331 and the second data signal lines 332. The second pixel driving circuits 31 in the same row are coupled to the same second scanning signal line 331. The second pixel driving circuits 31 in the same column are coupled to the same second data signal line 332. The second connecting line 37 is not coupled to the second pixel driving circuits 31.

For example, the second scanning signal lines 331 are formed from the gate metal layer, the second data signal lines 332 and the second connecting lines 37 are each formed from any of the first metal layer 214 and the second metal layer 215, and the manufacturing process is simple. The second scanning signal line 331 is, for example, coupled to the gate of the thin film transistor in the second pixel driving circuit 31. The second data signal line 332 is, for example, coupled to the first electrode of the thin film transistor in the second pixel driving circuit 31.

It will be noted that, in a case where the structures of the second pixel driving circuit 31 and the first pixel driving circuit 21 are the same, the second pixel driving circuit 31 and the first pixel driving circuit 21 are formed synchronously.

In some embodiments, with reference to FIGS. 1C, 1D, 1G, 1H, 2C, 2D and 7C, the driving panel 3 includes a first through hole 36. Alternatively, with reference to FIG. 7C, the driving panel 3 has a first transparent region 38.

In a case where the driving panel 3 is provided with the first through hole 36 therein, the first through hole 36 is used to receive the front camera 8. In a case where the driving panel 3 is provided with the first transparent region, an orthographic projection of the first transparent region on the display panel 2 overlaps with the orthographic projection of the front camera 8 on the display panel 2, so that the first transparent region may be used as a light extraction window of the front camera 8 when taking the picture. The light will sequentially pass through the second display region 262 of the display panel 2 and the first transparent region of the driving panel 3 to reach the front camera 8, so as to provide light required by the front camera 8 for operation.

It will be noted that, the drawings in the embodiments of the present disclosure only consider one first through hole 36 provided in the driving panel 3 as an example for illustration. In the case where the driving panel 3 is provided with the first transparent region, a position of the first transparent region is the same as or close to the position of the first through hole.

In some other embodiments, with reference to FIGS. 2G, 2H, 2K, and 2L, in a case where the display panel 2 is coupled to the driving panel 3 through the FPC 6, the FPC 6 may be provided with a second through hole 61 for receiving the front camera 8, or has a second transparent region as the light extraction window of the front camera 8.

The display apparatus 1 has same beneficial effects as the display panel 2, and details will not be repeated here.

The foregoing descriptions are merely specific implementations of the present disclosure. However, the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display assembly, comprising:
a display panel having a display region and a non-display region, the display region including a first display region and a second display region that are adjacent, and the display panel including:
first pixel driving circuits located in the first display region;
first light-emitting devices located in the first display region, a first pixel driving circuit being coupled to a first light-emitting device and configured to drive the first light-emitting device to emit light; and
second light-emitting devices located in the second display region; and a driving panel including second pixel driving circuits, a second pixel driving circuit being coupled to a second light-emitting device and configured to drive the second light-emitting device to emit light;

wherein the non-display region includes a first non-display region, a bendable region and a second non-display region that are sequentially away from the display region; the display panel further includes a first bonding portion, and the first bonding portion is located in the second non-display region; and the bendable region is located between the first non-display region and the second non-display region, a portion of the display panel located in the bendable region is configured to bend a portion of the display panel located in the second non-display region to a non-light exit side of the display panel.

2. The display assembly according to claim 1, wherein the driving panel further includes a second bonding portion, and the display panel is coupled to the driving panel through the first bonding portion and the second bonding portion.

3. The display assembly according to claim 2, wherein the first bonding portion includes a plurality of first bonding pads, and the second bonding portion includes a plurality of second bonding pads, wherein the plurality of first bonding pads are directly coupled to the plurality of second bonding pads, or the display assembly further includes a flexible printed circuit, and the plurality of first bonding pads are coupled to the plurality of second bonding pads through the flexible printed circuit.

4. The display assembly according to claim 2, wherein the display panel further includes a plurality of first signal lines, the plurality of first signal lines are each coupled to first pixel driving circuits and the first bonding portion, and configured to provide a driving signal for the first pixel driving circuits; and the driving panel further includes a plurality of second signal lines, some of the plurality of second signal lines are each coupled to second pixel driving circuits and the second bonding portion, and configured to provide a driving signal for the second pixel driving circuits.

5. The display assembly according to claim 4, wherein the display panel further includes a plurality of third signal lines and at least one gate driving circuit, the plurality of third signal lines are coupled to the gate driving circuit and the first bonding portion, the plurality of third signal lines are configured to provide driving signals for the gate driving circuit, and the gate driving circuit is configured to provide scanning signals for a part of the first signal lines; and the driving panel further includes second connecting lines, each second connecting line is coupled to a respective one of the plurality of third signal lines through the second bonding portion and the first bonding portion.

6. The display assembly according to claim 4, wherein the plurality of first signal lines include first scanning signal lines and first data signal lines, the plurality of second signal lines include second scanning signal lines and second data signal lines; each first scanning signal line and a respective second scanning signal line are coupled to be a scanning signal line, and each first data signal line and a respective second data signal line are coupled to be a data signal line;

the scanning signal line is coupled to first pixel driving circuits each coupled to a first light-emitting device and second pixel driving circuits each coupled to a second light-emitting device in a same row as the first light-emitting device; and the data signal line is coupled to first pixel driving circuits each coupled to a first light-emitting device and second pixel driving circuits each coupled to a second light-emitting device in a same column as the first light-emitting device, wherein first light-emitting devices and second light-emitting devices in a column consist of light-emitting devices with same orders in rows of light-emitting devices, and a part of the rows of light-emitting devices each include first light-emitting devices and second light-emitting devices.

7. The display assembly according to claim 1, wherein the display panel further includes first connecting lines; at least a portion of each first connecting line is located in the second display region, and a first connecting line couples the second light-emitting device to the second pixel driving circuit.

8. The display assembly according to claim 7, wherein a material of the portion of the first connecting line located in the second display region is a transparent conductive material.

9. The display assembly according to claim 1, wherein the display panel further includes first scanning signal lines and first connecting lines; a first scanning signal line is coupled to first pixel driving circuits and the first bonding portion; and a first connecting line is coupled to the second light-emitting device and the second pixel driving circuit;

the first scanning signal line includes a first scanning sub-pattern and a second scanning sub-pattern, the first scanning sub-pattern is located in the display region and the first non-display region, the second scanning sub-pattern is located in the bendable region and the second non-display region, and a conductivity of the second scanning sub-pattern is greater than a conductivity of the first scanning sub-pattern; and the first connecting line extends from the second display region into the second non-display region, the first connecting line includes a first connecting sub-pattern and a second connecting sub-pattern, the first connecting sub-pattern is located in the second display region and the first non-display region, the second connecting sub-pattern is located in the bendable region and the second non-display region, and a conductivity of the second connecting sub-pattern is greater than a conductivity of the first connecting sub-pattern.

10. The display assembly according to claim 9, wherein the display panel further includes first data signal lines, a first data signal line is coupled to first pixel driving circuits and the first bonding portion;

the first data signal line includes a first data sub-pattern, a second data sub-pattern and a third data sub-pattern, the first data sub-pattern is located in the display region, the second data sub-pattern is located in the first non-display region, the third data sub-pattern is located in the bendable region and the second non-display region; and the second data sub-pattern is disposed in a different layer from the first data sub-pattern and the third data sub-pattern.

11. The display assembly according to claim 10, wherein the first data signal line further includes a fourth data sub-pattern, the fourth data sub-pattern is configured to couple the first data sub-pattern to the second data sub-pattern; or the first data sub-pattern and the third data sub-pattern are disposed in a same layer and made of a same material; the first data signal line further includes a fourth data sub-pattern and a fifth data sub-pattern, the fourth data sub-pattern is configured to couple the first data sub-pattern to the second data sub-pattern, and the fifth data sub-pattern is configured to couple the second data sub-pattern to the third data sub-pattern.

12. The display assembly according to claim 10, wherein the second scanning sub-pattern, the second connecting sub-pattern and the third data sub-pattern are disposed in a same layer and made of a same material.

13. The display assembly according to claim 12, wherein the second data sub-pattern and the first scanning sub-pattern are disposed in a same layer and made of a same material.

14. The display assembly according to claim 1, wherein a pixel density of the first light-emitting devices is equal to a pixel density of the second light-emitting devices.

15. The display assembly according to claim 1, wherein the driving panel further includes at least one first through hole, or has a first transparent region.

16. A display apparatus, comprising the display assembly according to claim 1.

17. The display apparatus according to claim 16, further comprising at least one front camera located on a non-light exit side of the display assembly.

18. The display apparatus according to claim 17, wherein the driving panel in the display assembly further includes at least one first through hole, each front camera is located in a respective first through hole; or
  the driving panel in the display assembly has a first transparent region, an orthographic projection of the front camera on the display panel in the display assembly overlaps with an orthographic projection of the first transparent region on the display panel.

19. The display apparatus according to claim 16, further comprising a driving chip coupled to the display assembly and configured to provide driving signals for the display assembly.

* * * * *